(12) United States Patent
Towne et al.

(10) Patent No.: US 6,297,627 B1
(45) Date of Patent: *Oct. 2, 2001

(54) DETECTION OF PASSING MAGNETIC ARTICLES WITH A PEAK-TO-PEAK PERCENTAGE THRESHOLD DETECTOR HAVING A FORCING CIRCUIT AND AUTOMATIC GAIN CONTROL

(75) Inventors: Jay M. Towne, Newbury; Ravi Vig, Bow; P. Karl Scheller, Rochester, all of NH (US)

(73) Assignee: Allegro Microsystems, Inc.

( * ) Notice: Subject to any disclaimer, the term of this patent is extended or adjusted under 35 U.S.C. 154(b) by 0 days.

This patent is subject to a terminal disclaimer.

(21) Appl. No.: 09/239,023

(22) Filed: Jan. 27, 1999

Related U.S. Application Data

(60) Division of application No. 08/847,683, filed on Apr. 28, 1997, now abandoned, which is a continuation-in-part of application No. 08/587,406, filed on Jan. 17, 1996, now Pat. No. 5,694,038, and a continuation-in-part of application No. 08/587,405, filed on Jan. 17, 1996, now Pat. No. 5,729,130.

(51) Int. Cl.⁷ .............................. G01P 3/48; G01P 3/489; G01B 7/14

(52) U.S. Cl. .................................... 324/207.12; 324/207.2

(58) Field of Search .......................... 324/207.25, 207.2, 324/207.21, 207.12, 225, 173, 174, 166; 338/32 H, 32 R; 327/510, 511

(56) References Cited

U.S. PATENT DOCUMENTS

| | | |
|---|---|---|
| 4,180,704 | 12/1979 | Pettit . |
| 4,185,265 | 1/1980 | Griffin et al. .......................... 340/32 |
| 4,293,814 | 10/1981 | Boyer .................................... 324/166 |

(List continued on next page.)

FOREIGN PATENT DOCUMENTS

| | | | |
|---|---|---|---|
| 196 00 803 A1 | 11/1996 | (DE) | ........................... G01D/5/244 |
| 0 036 950 A1 | 2/1981 | (EP) | ........................... G06K/7/10 |
| 0 602 697 A1 | 11/1993 | (EP) | ........................... G01D/5/244 |

(List continued on next page.)

OTHER PUBLICATIONS

"An Engineering Approach to Digital Design", William I. Fletcher, pp. 14–19, Prentice Hall, Inc., 1980.

"Data Acquisition and Conversion Handbook", pp. 16–17, Datel–Intersil, Inc., Mansfield, Massachusetts, 1979.

"ATS612LSB, Advanced Information Data Sheet", Data sheet 27627.101, Allegro MicroSystems, Inc., 115 Northeast Cutoff, Box 15036, Worcester, Massachusetts 01615–0036, pp. 1–16, Sep. 6, 1996.

(List continued on next page.)

*Primary Examiner*—Walter E. Snow
(74) *Attorney, Agent, or Firm*—Daly, Crowley & Mofford, LLP

(57) ABSTRACT

A proximity detector for sensing a magnetic field includes a magnetic-field-to-voltage transducer for generating a signal voltage $V_{sig}$ that is proportional to the magnetic field, a peak-to-peak percentage threshold detector coupled to the magnetic-field-to-voltage transducer to receive the signal voltage $V_{sig}$ and for providing an output signal voltage $V_{out}$ and a forcing circuit coupled to the peak-to-peak percentage threshold detector for forcing and maintaining the value of the output signal voltage $V_{out}$ at a predetermined value during an initial startup interval of the proximity detector. The proximity detector may further include an automatic gain control circuit coupled to the forcing circuit to provide a proximity detector capable of operating in a peak-to-peak percentage threshold detector mode with automatic gain control.

25 Claims, 15 Drawing Sheets

U.S. PATENT DOCUMENTS

| | | | |
|---|---|---|---|
| 4,367,721 | 1/1983 | Boyer | 123/617 |
| 4,374,333 | 2/1983 | Avery | 307/309 |
| 4,443,716 | 4/1984 | Avery | 307/309 |
| 4,476,901 | 10/1984 | Sainen | 139/370 |
| 4,543,527 * | 9/1985 | Schuchmann et al. | 324/225 |
| 4,705,964 | 11/1987 | Higgs | 307/278 |
| 4,906,928 | 3/1990 | Gard | 324/240 |
| 4,992,731 | 2/1991 | Lorenzen . | |
| 5,103,171 | 4/1992 | Petersen . | |
| 5,291,133 | 3/1994 | Gokhale et al. | 324/207.25 |
| 5,317,258 | 5/1994 | Setzer et al. . | |
| 5,442,283 | 8/1995 | Vig et al. | 324/207.2 |
| 5,459,398 | 10/1995 | Hansen et al. | 324/166 |
| 5,477,142 | 12/1995 | Good et al. | 324/166 |
| 5,493,219 | 2/1996 | Makino et al. | 324/207.25 |
| 5,497,084 | 3/1996 | Bicking | 324/207.25 |
| 5,510,706 | 4/1996 | Good | 324/166 |
| 5,612,618 | 3/1997 | Arakawa . | |
| 5,694,038 | 12/1997 | Moody et al. . | |
| 5,729,127 | 3/1998 | Tamura . | |
| 5,821,745 | 10/1998 | Makino et al. . | |
| 5,917,230 * | 6/1999 | Scheller et al. | 324/207.2 |

FOREIGN PATENT DOCUMENTS

| | | | |
|---|---|---|---|
| 0 621 460 A1 | 4/1994 | (EP) | G01D/5/244 |
| 0 875 733 A2 | 1/1998 | (EP) | G01D/3/02 |
| 0 875 774 A2 | 11/1998 | (EP) | G01V/3/08 |
| 2309311 A | 1/1997 | (GB) | G01D/5/244 |
| 4-353765 | 8/1992 | (JP) . | |
| 6-18905 | 11/1994 | (JP) . | |

OTHER PUBLICATIONS

"*ATS630LSA and ATS631LSA, Zero–Speed, Self–Calibrating, Hall–Effect Gear–Tooth True Power–On Sensors*",Data sheet 27627.120, Allegro MicroSystems, Inc., 115 Northeast Cutoff, Box 15036, Worcester, Massachusetts 01615–0036, twelve pages, Oct. 28, 1996.

"*Motorola Linear/Interface Integrated Circuits*", data sheet, Series D, Motorola Inc., 1983, two pages.

"*Operational Amplifiers Design and Applications*", Jerald G. Graeme, et al., McGraw–Hill Book Company, pp. 1, 352–353, not dated.

"*ATS630, ATS631: True Power On, Self–Calibrating Zero Speed Gear Tooth Sensor System*", Preliminary Data Sheet, Allegro MicroSystems, Inc., Rev. 2.6; R. Vig, pp. 1–8, not dated.

EP Search Report for Application No. EP 98302577.

* cited by examiner

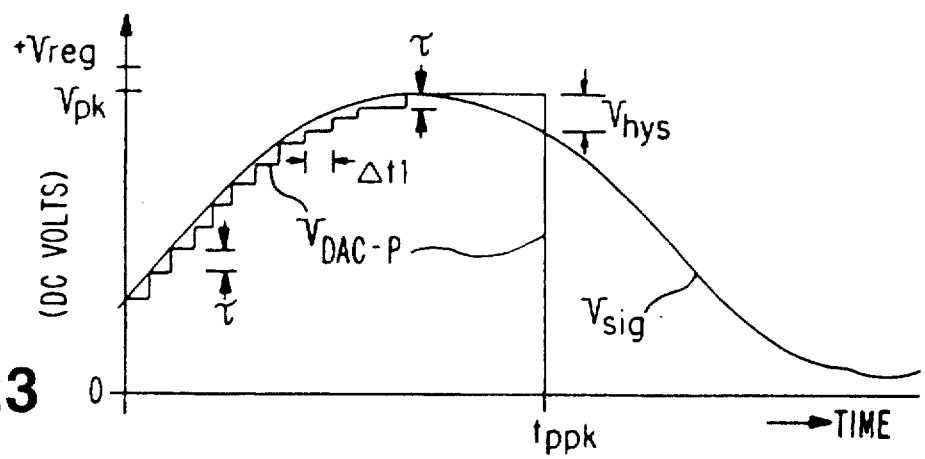
FIG. 23
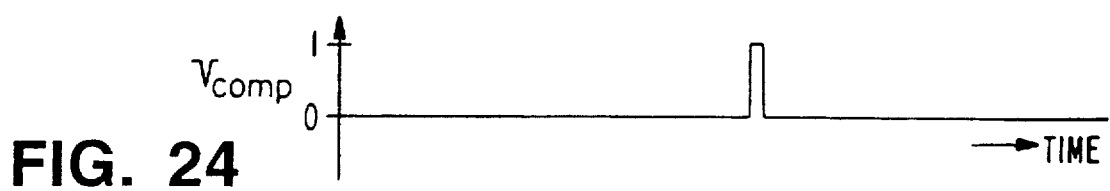
FIG. 24
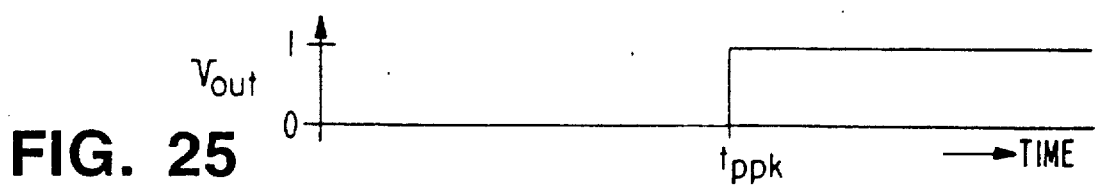
FIG. 25
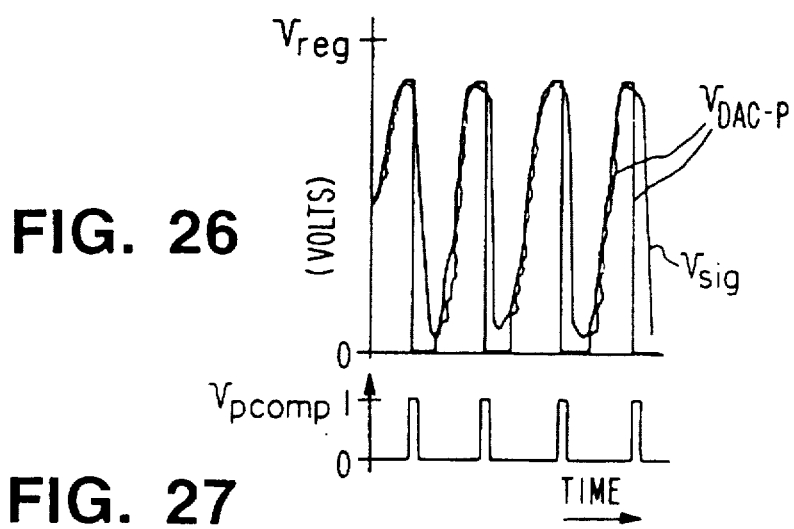
FIG. 26
FIG. 27

DETECTION OF PASSING MAGNETIC ARTICLES WITH A PEAK-TO-PEAK PERCENTAGE THRESHOLD DETECTOR HAVING A FORCING CIRCUIT AND AUTOMATIC GAIN CONTROL

RELATED APPLICATIONS

This application is a divisional of U.S. patent applicant Ser. No. 08/847,683, filed Apr. 28, 1997, now abandoned, which is a continuation-in-part of U.S. patent application Ser. No. 08/587,405, filed Jan. 17, 1996 which issued on Mar. 17, 1998 as U.S. Pat. No. 5,729,130 and U.S. patent application Ser. No. 08/587,406, filed Jan. 17, 1996 which is issued on Dec. 2, 1997 as U.S. Pat. No. 5,694,038.

BACKGROUND

This invention relates to a proximity detector, and especially to a ferrous-gear-tooth Hall-transducer, or other magnetic-field-to-voltage transducer, capable of detecting the leading and wailing gear tooth edges of an adjacent rotating ferrous gear, or other magnetic articles, and more particularly relates to such a Hall proximity detector with an automatic gain adjust feature in the Hall-voltage amplifier The term "magnetic article" as used herein applies to magnetized bodies, ferrous bodies and other bodies having a low magnetic reluctance that tend to alter the ambient as magnetic field.

In the U.S. Pat. No. 5,442,283, issued Aug. 15, 1995 there is described a Hall-voltage slope-activated proximity-detector capable of detecting the rising and falling edges of an adjacent rotating gear tooth. This proximity-detector type detector includes an integrated circuit Hall detector mounted to a pole of a magnet, and includes a circuit for tracing a slope of a Hall voltage (e.g. corresponding to the approach of a passing gear tooth) and briefly holding the ensuing peak voltage before producing an output signal indicating the onset of the following Hall-voltage slope of opposite direction (e.g. corresponding to the approach of a valley between two gear teeth). The Hall voltage holding circuit includes a capacitor and circuit means for controllably leaking charge out of or into the capacitor for preventing false tripping of a comparator that provides the pulse output signal.

The holding voltage of the capacitor thus has a droop which leads to increasing loss of holding accuracy as the speed of gear tooth passage becomes slower, and therefore the detector has a minimum gear teeth speed at which accurate detection is possible.

Most proximity detectors of the prior art produce a high binary output voltage indicating approach and proximity of a passing article, and produce a low binary voltage when the article recedes from the detector. The transition in detector output voltage from low to high typically is triggered by a comparator that determines when the transducer voltage rises to a fixed internal threshold voltage reference. Alternatively, in the case of the above described slope-activated detector, the detector determines when a transducer voltage peak has just occurred and the transducer signal voltage drops a predetermined incremental voltage from the peak value.

Prior art proximity detectors having fixed threshold voltages, produce low to high (or high to low) binary transitions in the output signal indicating approach of a magnetic article. In practice, the closest passing distance (sometimes referred to as the air gap) does not remain constant.

Variations of the air gap dimension causes shifts in the actual distances of article approach and receding at which the transducer voltages exceeds or falls below the fixed thresholds. This results in a lack of accuracy of passing detection that may rule out their use as position detectors of passing articles such as cams and gear teeth.

Changes in the air gap, between passing articles to be detected and the transducer, may be attributable to mechanical and electrical properties of the detector as well as in the properties of the passing articles, especially as a function of temperature.

The result is a detection inaccuracy that may rule out the use of such detectors for such critical applications as in combustion-engine ignition distributors. Prominent causes of this inaccuracy stem from the fact that the amplitude of the Hall voltage changes when gear teeth (articles) have different ferro-magnetic properties from tooth to tooth, and/or when undulating changes in the spacings (air gap) of gear teeth to detector are caused by eccentricity of the gear. Also, changes in temperature cause changes in air gap dimensions and in the sensitivity of the transducer and transducer-voltage amplifier.

Whether detection is accomplished by sensing the Hall voltage peaks or using a voltage threshold criteria for indicating approach of a passing article, changes in the median amplitude of the transducer voltage degrade the accuracy of position detection.

Over multiple installations, the effective air gap to which a transducer in the proximity detector may be subject can vary by several millimeters. At a relatively wide air gap, the amplitude of the peak to peak signal generated by the transducer such as the Hall device is many times less than the amplitude of the same signal at a relatively close or narrow air gap. To provide an electrical signal having a substantially constant peak to peak signal amplitude over a majority of the air gap range, the proximity detectors employ automatic gain control (AGC).

With AGC, the gain can be opted for each air gap to which the proximity detector may be subject after power up. At relatively narrow air gaps, the AGC minimizes the gain to ensure that a magnetic signal having a relatively large amplitude will not result in clipping or other distortion of the electrical signal generated by the transducer. At relatively wide air gaps, the AGC maximizes the gain to thus allow processing of electrical signals generated from a magnetic signal having a relatively small amplitude. Thus, by using AGC, the a proximity detector can operate over a relatively wide range of air gaps. Moreover, by providing an electrical signal having a substantially constant peak-to-peak signal amplitude regardless of air gap width, the proximity detector provides improved timing accuracy over the entire range of air gap widths.

SUMMARY OF THE INVENTION

Although peak detectors can detect down to zero speeds, to more accurately detect speeds down to zero, the peak-to-peak percentage threshold detector was conceived. The peak-to-peak percentage threshold detector is sometimes referred to herein as a "threshold detector" or "a zero-crossing mode detector." One problem with peak-to-peak percentage threshold detectors, however, is that it is relatively difficult to start the proximity detector in peak-to-peak percentage threshold detector mode due to erratic and inaccurate switching of the detector output signal caused by the peak-to-peak percentage threshold detector not having the eventual peak and valley values acquired at startup. If the proximity detector includes AGC, whenever AGC is activated, a similar situation arises. Thus, while using AGC improves timing accuracy over air gap, adjusting the gain at any time in a peak-to-peak percentage threshold detector is relatively difficult. For this reason, zero-speed Hall effect gear tooth proximity detectors having AGC do not initially start in peak-to-peak percentage threshold mode, but rather start in a peak detector mode of operation. Furthermore, in previous detectors, the AGC function is activated only while the proximity detector is in peak-detector mode.

In proximity detectors which initially start in peak detector modes immediately after initial power up, the proximity detector has a pair of digital-to-analog converters (DACs) which respectively captures positive and negative peaks of a transducer signal, and switch on some threshold voltage referenced from each peak. Detectors operating in this mode, will hereinafter sometimes be referred to simply as "a peak-referenced detector", "a peak detector" or "a slope-activated detector". After some number of initial cycles, e.g. sixteen cycles, he proximity detector changes from peak-detector mode to peak-to-peak percentage threshold-detector mode.

The initial peak detector mode allows AGC to occur, which could not heretofore be done one increment at a time in proximity detectors operating in the peak-to-peak percentage threshold detector mode without possible false transitions. Also, the initial startup time period is necessary to be certain that peaks which have been captured represent accurately the a peaks of the magnetic signal in that particular magnetic circuit. It is advantageous to switch from peak detector mode to peak-to-peak percentage threshold mode because in peak-to-peak percentage threshold mode, the switch points are relative to the peak to peak value of the signal which provides improved timing accuracy over variations in air gap.

It would, therefore, be desirable to provide a proximity detector which can initially start in peak-to-peak percentage threshold mode. It would also be desirable to provide a proximity detector which can utilize AGC in peak-to-peak percentage threshold mode. It would be further desirable to provide a circuit which can startup in peak-to-peak percentage threshold detector mode with AGC active.

In accordance with the present invention, a proximity detector for sensing magnetic articles includes a magnetic-field-to-voltage transducer for generating at an output port thereof a signal voltage, $V_{sig}$, that is proportional to a magnetic field, a peak-to-peak percentage threshold detector having an input port coupled to the output port of said magnetic-field-to-voltage transducer to receive the signal voltage $V_{sig}$ and for providing an output signal voltage $V_{out}$ and a forcing circuit coupled to said peak-to-peak percentage threshold detector for forcing and maintaining the value of the output signal voltage $V_{out}$ at a first predetermined value during an initial startup interval of the proximity detector. With this particular arrangement a proximity detector which initially starts in a peak-to-peak percentage threshold detector mode of operation is provided. Since there is no transition from pea mode to peak-to-peak percentage of threshold mode as in prior art proximity detectors, there is no abrupt change in timing accuracy.

The peak-to-peak percentage threshold detector includes a first tracking circuit which generates at an output port thereof a signal voltage PDAC that tracks the highest peak of the signal voltage $V_{sig}$ and a second tracking circuit which generates at an output port thereof a signal voltage NDAC that tracks the lowest peak of the signal voltage $V_{sig}$. Since the proximity detector initially stats in peak-to-peak percentage threshold mode, the signal PDAC provided by the first tracing circuit is initially set to a reset value which is lower than the least positive expected value of the signal voltage $V_{sig}$ and the signal NDAC provided by the second tracking circuit is set to a reset value which is greater than the least negative expected value of the signal voltage $V_{sig}$. With this technique, the first and second tracking circuits are ensured to capture, respectively, the positive and negative peaks of the signal $V_{sig}$ even with a large negative or positive offset voltage. In one particular embodiment, the proximity detector utilizes a regulated supply voltage of 3.0 volts (V) and the reset value for the PDAC signal provided by the first tracking circuit is 0.57V, and while the reset value for the NDAC signal provided by the second tracking circuit is 2.43V.

With the reset values of PDAC and NDAC as above, during the initial proximity detector startup, the value of NDAC is more positive than the value of PDAC. This relationship of PDAC to NDAC (i.e. PDAC less than NDAC) is not a condition in which the peak-to-peak percentage threshold detector can properly operate. As the first and second tracking circuits acquire the positive and negative peaks, respectively, the values of PDAC and NDAC will cross each other, and at one instant, the value of PDAC will equal the value of NDAC. Consequently, threshold voltages derived from the values of PDAC and NDAC will also be equal. At this point, the output signal $V_{out}$ of the peak-to-peak threshold detector would normally switch. In the present invention, however, the forcing circuit coupled to the peak-to-peak percentage threshold detector forces and maintains the value of the output signal voltage $V_{out}$ at a first predetermined value during an initial startup interval of the proximity detector. The forcing circuit may be provided for example, from one or more transistor switches, a logic circuit or a current source which biases or otherwise forces the output signal voltage $V_{out}$ to a first predetermined voltage level until $V_{sig}$ has changed value by a predetermined amount or until a predetermined period of time passes.

In accordance with a further aspect of the present invention, a proximity detector for sensing magnetic articles includes a magnetic-field-to-voltage transducer for generating at an output port thereof a signal that is proportional to a magnetic field and an automatic gain control circuit for adjusting the amplitude of a signal voltage $V_{sig}$, the automatic gain control circuit having an input port coupled to the output port of said magnetic-field-to-voltage transducer and having an output port, automatic gain control circuit for controlling the amplitude of a signal voltage $V_{sig}$. The proximity detector further includes a peak-to-peak percentage threshold detector coupled to the automatic gain control circuit and a forcing circuit coupled to the automatic gain control circuit and the peak-to-peak percentage threshold detector. The peak-peak p age threshold detector receives the signal voltage $V_{sig}$ and provides an output signal voltage $V_{out}$. The forcing circuit maintains the value of the output signal voltage $V_{out}$ at a first predetermined value to prevent the peak-to-peak percentage threshold detector from switching prior to one of a positive or negative excursion of the signal voltage $V_{sig}$ reaching a predetermined voltage when the automatic gain control circuit adjusts the amplitude of the signal voltage $V_{sig}$. With this particular arrangement, a proximity detector which can operate in peak-to-peak percentage threshold detector mode with automatic gain control (AGC) is provided.

The threshold detector operates as described above, however, when the AGC function is activated, the peak to peak value of the signal $V_{sig}$ changes almost instantaneously due to the change in gain caused by the AGC. When this happens, the first and second tracking circuits in the peak-to-peak percentage threshold detector do not hold the correct values of the respective peaks, and the signal could decrease because of AGC to the point where it will no longer cross the thresholds of the peak-to-peak percentage threshold detector. This would cause the proximity detector output signal $V_{out}$ to simply stop switching. Even if the proximity detector output signal $V_{out}$ does not stop switching, the timing accuracy will suffer since the thresholds will no longer be in the correct location relative to the actual peak to peak electrical signal. This is because the thresholds are generated from the outputs of the first and second tracking circuits which, under these conditions, would no longer represent the actual positive and negative peaks of the magnetic signal. To overcome these problems, the two tracking circuits are reset when the AGC is activated, such that the signal PDAC provided by the first tracking circuit is set to a value which is lower than the least positive expected value of the signal voltage $V_{sig}$ and the signal NDAC provided by the second tracking circuit is set to a value which is greater than the least negative expected value of the signal voltage $V_{sig}$. Thus, in this reset state, the value of PDAC is less than the value of NDAC. Since during normal operating conditions of the proximity detector, the value of PDAC is greater than the value of NDAC, the reset values of PDAC and NDAC would cause the output signal voltage $V_{out}$ to switch incorrectly. Accordingly, when the first and second tracking circuits are reset, the signal $V_{out}$ must be reinforced in its present binary state so that it will not switch due to the values of PDAC and NDAC being set to their reset values. The first and second tracking circuits are then allowed to require the new peaks of the positive and negative going excursions of the signal $V_{sig}$. The output signal $V_{out}$ is maintained in the present binary state until the value of PDAC exceeds the value of NDAC by a predetermined voltage while the PDAC and NDAC values require the respective positive and negative peak values of the signal $V_{sig}$. It should be noted that the values of PDAC and NDAC require the appropriate values of $V_{sig}$ relatively quickly and thus the reset condition has minimal impact on the performance of the proximity detector.

The reinforcement of the proximity detectors present binary state is accomplished with the use of a forcing circuit which forces and maintains the output voltage $V_{out}$ in a predetermined one of its binary states. In one particular embodiment, the forcing circuit is provided from a pair of switches coupled to an input of a threshold comparator of the peak-to-peak percentage threshold detector. The switches are synchronized to the comparator's output. One or the other of the switches is activated to force a reference input to the comparator to one of first and second voltage levels, depending on the present polarity of the output of the threshold comparator. A separate comparator is used to release the forcing circuit after the value of PDAC is a predetermined voltage greater than the value of NDAC. The release comparator is necessary because the proximity detector is incapable of switching while the forcing circuit maintains the output signal at the predetermined voltage. Thus, the release comparator allows the threshold comparator to return to normal operation once the values of PDAC and NDAC take on values within a predetermined range of values relative to one another.

In accordance with a still further aspect of the present invention, a proximity detector of passing magnetic articles includes a magnetic-field-to-voltage transducer for sensing an ambient magnetic field and generating a voltage, $V_H$, having an amplitude that is directly related to the magnetic field. A digitally gain controlled amplifier is connected to the transducer for amplifying $V_H$. A DC voltage source is provided for generating a target-voltage $V_{TG}$, and a comparator means has inputs connected to the output of the amplifier and to a DC reference voltage for generating a binary signal $V_{toobig}$ that changes from one to another binary level each time that $V_{sig}$ exceeds $V_{TG}$.

A circuit means is connected to the output of the amplifier for sensing and counting the excursions of the one polarity in $V_{sig}$, and for producing a binary count output signal. The output of the circuit means is connected to the amplifier and the circuit means is additionally for at each of the counted excursions in $V_{sig}$, incrementally changing the transducer gain in the direction to bring the peaks in $V_{sig}$ to just below the target value $T_{TG}$. This proximity detector also includes a circuit means connected to the output of the amplifier for generating a proximity-detector output voltage, $V_{out}$, having transitions of one polarity each time excursions of the one polarity in $V_{sig}$ reach a predetermined point therein.

In accordance with a yet still further aspect of the present invention, a proximity-detection method for detection of passing magnetic articles begins by sensing an ambient magnetic field and generating a voltage, $V_H$, having an amplitude that is directly related to the magnetic field. The voltage $V_H$ is amplified in a digitally-gain-controlled amplifier to generate an amplified signal $V_{sig}$. The following steps include comparing the amplitudes of the excursions of at least one polarity in $V_{sig}$ to a predetermined target value, generating a digital signal that changes from one to another binary level when $V_{sig}$ exceeds the target value, applying the digital signal to the digitally-gain-controlled amplifier and changing the gain of the digitally-gain-controlled amplifier in the direction to bring the peak values in $V_{sig}$ to just below the predetermined target value. Finally a binary proximity-detector output voltage $V_{out}$ is generated having transitions of one polarity each time excursions of one polarity in $V_{sig}$ reach a predetermined point therein.

It is preferable that the generation of $V_{out}$ be accomplished by a slope-activated proximity detector method such as those described in patent application Ser. No. 08/587,405 entitled DETECTION OF PASSING MAGNETIC ARTICLES AT SPEEDS DOWN TO ZERO AND CIRCUIT THEREFOR which issued on Mar. 17, 1998 as U.S. Pat. No. 5,729,130 or the above-noted U.S. Pat. No. 5,442,283.

The comparing the amplitudes of the excursions of at least one polarity in $V_{sig}$, and the general digital signal for incrementally changing the gain of the digitally-gain-controlled amplifier, may only be for one initial predetermined interval. Each incremental change in gain is preferably a fixed predetermined increment of gain change. There may be added the steps of counting the excursions of at least one polarity and terminating the one initial predetermined interval when the count reaches a predetermined number.

A method for detection of passing magnetic articles comprises sensing an ambient magnetic field and generating a voltage, $V_{sig}$, that is proportional to the magnetic field, converting positive slope portions only of the analog signal $V_{sig}$ to a digital signal $V_{Pcount}$, converting the digital signal $V_{Pcount}$ to a positive $V_{sig}$-tracking analog signal $V_{DAC-P}$, holding $V_{Pcount}$ at each peak positive excursion in $V_{sig}$, and when at time $t_{ppk}$ after each positive peak in $V_{sig}$, $V_{sig}$ has fallen below $V_{DAC-P}$ by a predetermined amount, producing one detector pulse ($V_{pcomp}$) indicating the detection of approach of a passing magnetic article. The preferred method additionally includes converting negative slope portions only of the analog signal $V_{sig}$ to a digital signal $V_{Ncount}$, converting the digital signal $V_{Ncount}$ to a negative $V_{sig}$-tracking analog signal $V_{DAC-N}$, holding $V_{Ncount}$ at each peak negative excursion in $V_{sig}$, and when at time $t_{npk}$ after each negative peak in $V_{sig}$, $V_{sig}$ has risen above $V_{DAC-N}$ by a predetermined amount, producing another detector pulse ($V_{ncomp}$) indicating the detection of leaving of a passing magnetic article.

The method may be additionally comprised of, at time $t_{ppk}$ enabling starting the converting of the digital signal $V_{Ncount}$ to a negative $V_{sig}$-tracking analog signal $V_{DAC-N}$, and at time $t_{npk}$ starting the converting of the positive slope portions only of the analog signal $V_{sig}$ to a digital signal $V_{Pcount}$.

The method may also include generating a binary output signal that at times $t_{ppk}$ changes to one binary level and that at times $t_{npk}$ changes from the one to the other binary level, so that the binary output signal is at one level when the magnetic-field proportional signal, $V_{sig}$, has a positive slope and is at the other level when the magnetic-field proportional signal, $V_{sig}$, has a negative slope.

This invention as so encompasses a proximity sensor of magnetic articles that includes a magnetic-field-to-voltage transducer for generating a signal, $V_{sig}$, that is proportional to the magnetic field. The transducer may for example consist of a Hall element followed by a Hall-voltage amplifier. One digital signal is generated by one transducer-voltage comparator (OTVcomp), a first circuit branch dirty connects the output of the transducer and the one OTVcomp input, and a second circuit branch connected between the transducer output and another input of the OTVcomp.

The second circuit branch is for producing a binary detector output signal having a transition of one polarity at the time of the occurrence of a positive peak $t_{ppk}$ in $V_{sig}$, and toward doing so employs a positive peak detector (PPD) comprised of the one Schmitt comparator (OScomp) having one input connected via the first circuit branch to the transducer output, employs one digital-to-analog converter (P-DAC) that has an output connected to the another input of the OTVcomp, employs a clock that generates a stream of clock pulses, and employs one AND gate.

One counter has a count input connected to the output of the clock, and has a count enable input connected to the output of the OTVcomp via the one AND gate which entails the OTVcomp output being connected to one of the one AND gate inputs. The one counter counts the clock pulses only when an enable signal at one binary level appears at the count enable input. The one counter counts the clock pulses only when $V_{sig}$ has a positive slope. The P-DAC additionally tracks a positive slope portion of $V_{sig}$ and holds the ensuing positive peak voltage of $V_{sig}$ until a time $t_{ppk}$ at which $V_{sig}$ recedes from the held positive peak voltage by an amount equal to the threshold Vhys of the OScomp. The pulse output from the OScomp comparator indicates the time of peaking of a positive pulse in the transducer signal $V_{sig}$. A reset signal generating means is connected to the output of the one OScomp which generating means has an output connected to the reset input of the counter for resetting the one counter at time $t_{ppk}$.

In a further development of the detector circuit, the second circuit branch additionally includes a negative peak detector (NPD), that may be a mirror image circuit to the positive peak detector (PPD), and thus including another transducer-voltage comparator (ATVcomp), an N-DAC, another Schmitt comparator (AScomp) and another AND gate. The AScomp output is connected to the another input of the another AND gate to cause in the another Schmitt comparator output a transition of one polarity at the time of the occurrence of a negative peak $t_{npk}$ in $V_{sig}$.

The NPD is further for disabling the one counter at the beginning of the next positive slope portion, and thereby causing the output of the P-DAC to go to zero. This permits the one counter to count and the P-DAC to track and hold the voltage $V_{sig}$, as before, during the next positive slope portion of $V_{sig}$. These features constitute synergy between the NPD and the PPD whereby the positive and negative tracking of $V_{sig}$ is, during each period in $V_{sig}$, triggered by the NPD to begin in the PPD and visa versa.

The first and second digital signals generated in the clock during the tracking respectively of the positive and negative slopes in $V_{sig}$ makes it possible to hold indefinitely the peak values in the counter, and thus in the P-DAC and the N-DAC, and therefore enables the proximity detector of this invention to detect the passing of magnetic articles at down to zero speeds, unlike in any of the prior art proximity detectors of the past half a century.

BRIEF DESCRIPTION OF THE DRAWINGS

FIG. 3 shows a partial waveform of the output voltage signal $V_{N1}$ from the NDAC1 in FIG. 1.

FIG. 4 shows a waveform of output voltage, $V_{out}$, of the proximity-detector of FIG. 1.

FIG. 5 shows a waveform of the reset signal to the counter 17 in the proximity-detector of FIG. 1.

FIG. 6 shows a waveform of the reset signal to the counter 27 in the proximity-detector of FIG. 1.

FIG. 7 shows a waveform of the latch enable signal to the N latch 52 in the proximity-detector of FIG. 1.

FIG. 8 shows a waveform of the latch enable signal to the P latch 42 in the proximity-detector of FIG. 1.

FIG. 10 shows a corresponding waveform of output voltage, $V_{out}$, of the proximity-detector of FIG. 1.

FIG. 11 shows a corresponding output signal waveform of comparator 62, $V_{toobig}$, in the proximity-detector of FIG. 1.

FIG. 12 shows corresponding waveforms of the binary output voltages from the first two bits in gain counter (G-COUNTER) 67 of the proximity-detector of FIG. 1.

FIG. 14 shows the waveform of a positive peak portion of $V_{sig}$ during which automatic gain control (AGC) is effected.

FIG. 15 shows a waveform of the binary signal Vbig in the AGC circuit.

FIG. 16 shows the waveform of the binary signal Vclk in the AGC circuit.

FIG. 17 shows the waveform of the binary signal $V_R$ in the AGC circuit.

FIG. 18 shows the count in counter 118 which sets the gain of amplifier 110 for successive intervals during automatic gain control.

FIG. 23 shows a waveform of the Hall voltage, $V_{sig}$, in the circuit of FIG. 22 which waveform corresponds to the passage of one ferrous gear tooth (or other magnetic article).

FIG. 24 shows the waveform of the output signal, Vcomp, from the comparator, OScomp, of FIG. 22. Each pulse in Vcomp indicates the onset of the trailing edge of the single passing gear tooth. FIGS. 23 and 24 are drawn to the same time scale.

FIG. 25 again shows a waveform of $V_{out}$ in the circuit of FIG. 22.

FIG. 26 shows the waveform of several periods in the amplified Hall voltage, $V_{sig}$, in the detector of FIG. 22.

FIG. 27 is drawn to the same scale as FIG. 26 and shows the pulses in signal the Vcomp that correspond to the positive peaks in the Hall voltage $V_{sig}$.

DESCRIPTION PREFERRED EMBODIMENTS

Figure 1:
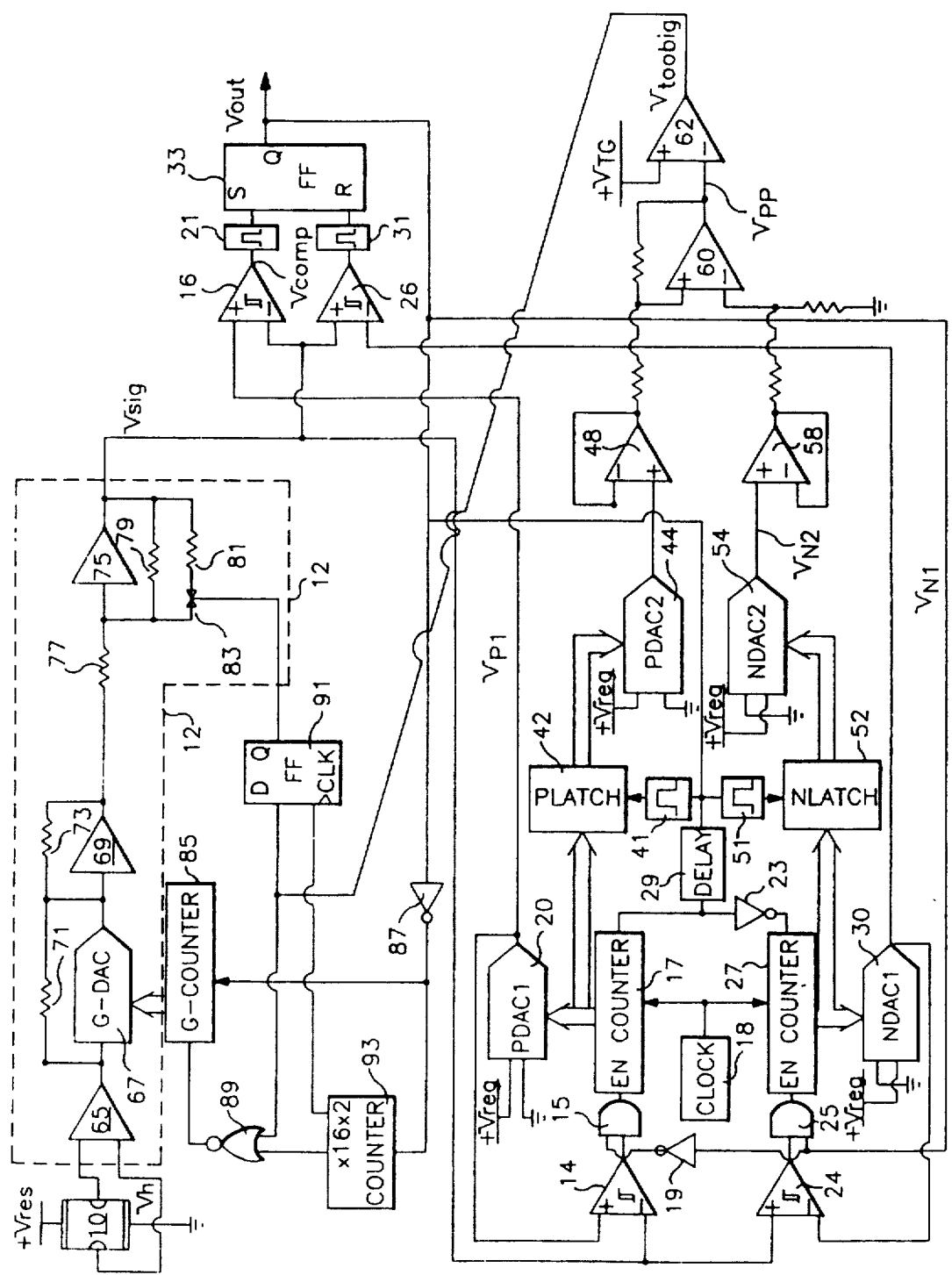
FIG. 1 shows a block diagram of a first magnetic-article proximity detector.

The Hall element 10 of FIG. 1 has an output connected to the input of a Hall voltage amplifier 12. Hall element 10 may mounted at a pole of a magnet (not shown), so that when a ferrous article approaches, the Hall voltage $V_H$ and thus the amplified Hall voltage $V_{sig}$ increase (or decrease). When the article recedes, $V_H$ and $V_{sig}$ decrease (or increase depending upon the polarity of the magnet pole). Alternatively, the detector circuit of FIG. 1 may be used to detect magnetic articles that themselves are magnetized, in which case the Hall element need not be mounted with a magnet.

A magneto resistors bridge (not shown) may be substituted for the Hall element. And two Hall elements with their outputs connected differentially to the input of the Hall voltage amplifier (not shown) represents a second alternative magnetic-field-to-voltage transducer.

The amplified Hall voltage, $V_{sig}$, is manipulated by the remaining circuits in the proximity detector of FIG. 1 to produce a square wave proximity-detector output signal, $V_{out}$, that like a shadow graph reflects the profile of the passing articles.

The amplified Hall voltage $V_{sig}$ is applied to the positive input of a first comparator 14, and is also applied to the negative input of a second comparator 16. The amplified Hall voltage $V_{sig}$ is further applied to the negative input of the other first comparator 24 and to the plus input of the other second comparator 26.

Assuming, as a staring point, that the counter 17 is at zero count, when the output of the first comparator 14 goes high the counter 17 begins counting the clock pulses from clock 18. The resulting count is presented to the digital-to-analog converter (PDAC1) 20 which produces an output analog voltage $V_{P1}$ always lying somewhere within the range from zero to the DC supply voltage, $+V_{reg}$. At any instant the amplitude of $V_{P1}$ is a direct linear function of the count signal from counter 17. When power is first applied to the detector circuit, a logic block (not shown) senses the time of turning on of the DC supply voltage, $+V_{reg}$, and resets the counters to zero count.

Figure 2:
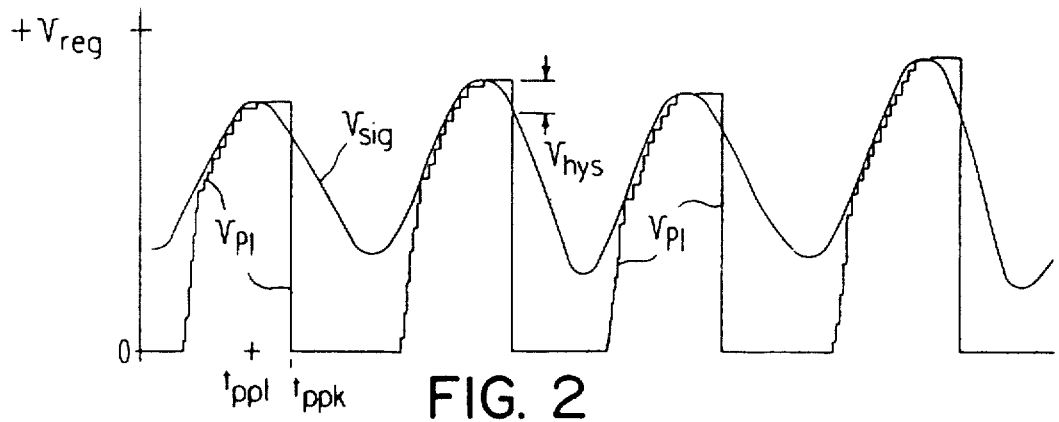
FIG. 2 shows a waveform of the Hall (transducer) voltage signal, during passage of four magnetic articles, superimposed on a waveform of the output voltage signal $V_{P1}$ from the PDAC1.

The comparator 14 has hysteresis and so is a Schmitt type comparator. The output of the DAC 20 (PDAC1) is connected to the negative input of the comparator 14 so that whenever $V_{sig}$ becomes greater than voltage $V_{P1}$ plus the small hysteresis threshold voltage of the comparator 14, then the comparator 14 output goes high. If at that time $V_{out}$ is low, then the outputs of inverter 19 and gate 15 go high and the counter 17 is enabled and counting. When $V_{sig}$ is growing more positive, $V_{P1}$ is caused to track $V_{sig}$ in stair step fashion, as is illustrated in FIG. 2. The incremental vertical excursions of the stair stepped $V_{P1}$ are equal to $V_{reg/2n}$, where n is the number of DAC bits. The incremental horizontal times, ∆t1, increase as the slope of $V_{sig}$ decreases.

Figure 4:
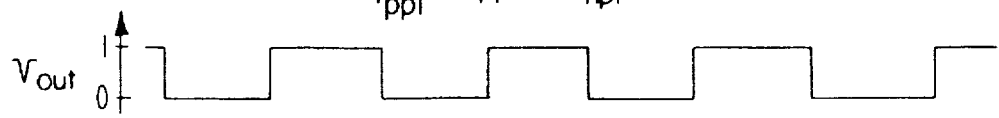

As is illustrated in FIG. 2, when a peak positive voltage of $V_{sig}$ is reached, the counter 17 stops counting at a time $t_{pp1}$, and $V_{P1}$ holds this peak voltage until time $t_{ppk}$. At time $t_{ppk}$, $V_{sig}$ falls below the held voltage $V_{P1}$ by an amount Vhys equal to the threshold of comparator 16, and the output of comparator 16 goes high briefly setting the flip flop 33 so that $V_{out}$ goes from low to high, as seen in FIG. 4. The pulse expander circuits 21 and 31, shown as one-shot pulse generators in FIG. 1, have their inputs respectively connected to the outputs of comparators 16 and 26, and have their outputs respectively connected to the set and reset inputs of flip flop 33.

Figure 5:
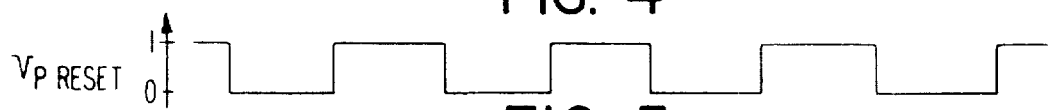
Figure 6:
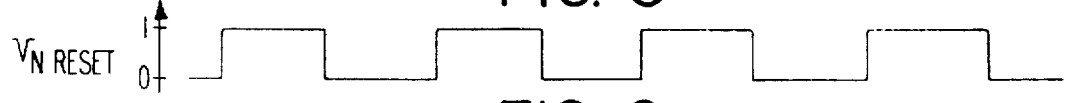

$V_{out}$ is applied to the reset input of the counter 17 via a delay circuit 29, resetting and holding the count in counter 17 to zero at time $t_{ppk}$ (FIG. 5) for as long as the reset signal $V_{Preset}$ is high; thus $V_{P1}$ remains at zero volts for that time also. At a subsequent positive pulse in the signal $V_{sig}$, $V_{P1}$ again begins to track the subsequent positive pulse to its peak and to hold that new peak voltage. The reset signal (FIG. 6) resets the counter 27 via inverter 23 at times $t_{npk}$ and holds reset counter 27 for as long as the reset signal $V_{Nreset}$ is high.

Figure 3:
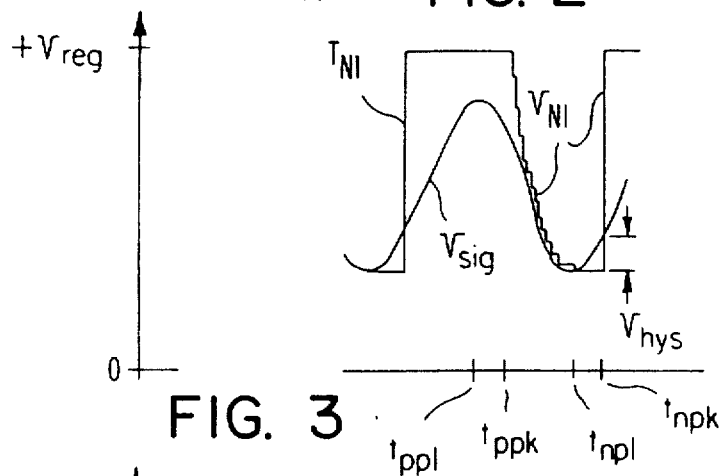
FIGS. 3, 4, 5, 6, 7 and 8 are drawn to the same time scale as that of FIG. 2.

A lower (N) circuit portion in the proximity detector of FIG. 1 essentially mirrors the construction of the upper (P) portion just described. The lower circuit portion manipulates the negative pulses in $V_{sig}$ in the same way as does the upper portion with respect to positive pulses in $V_{sig}$. For example, as is illustrated in FIG. 3, when a peak negative voltage of $V_{sig}$ is reached, the counter 27 stops counting at a time $t_{npl}$, and $V_{N1}$ holds this peak voltage until time $t_{npk}$. At time $t_{npk}$, $V_{sig}$ falls below the held voltage $V_{N1}$ by an amount Vhys equal to the threshold of comparator 26, and the output of comparator 26 goes high to reset the flip flop 33 so that $V_{out}$ goes from high to low, as seen in FIG. 4.

The part of the proximity detector of FIG. 1 described above operates in a digital peak detecting mode. Such a detector is the subject of a patent application Ser. No. 08/587,405, entitled DETECTION OF PASSING MAGNETIC ARTICLES AT SPEEDS DOWN TO ZERO, that is assigned to the same assignee as is the current application and is filed concurrently herewith and which issued on Mar. 17, 1998 as U.S. Pat. No. 5,729,130. That application describes the proximity detector circuit and operation in greater detail and is incorporated by reference herein.

The remainder of the circuit in FIG. 1 relates to circuitry for the automatic gain control circuit of the Hall voltage.

Figure 7:
Figure 8:
Figure 9:
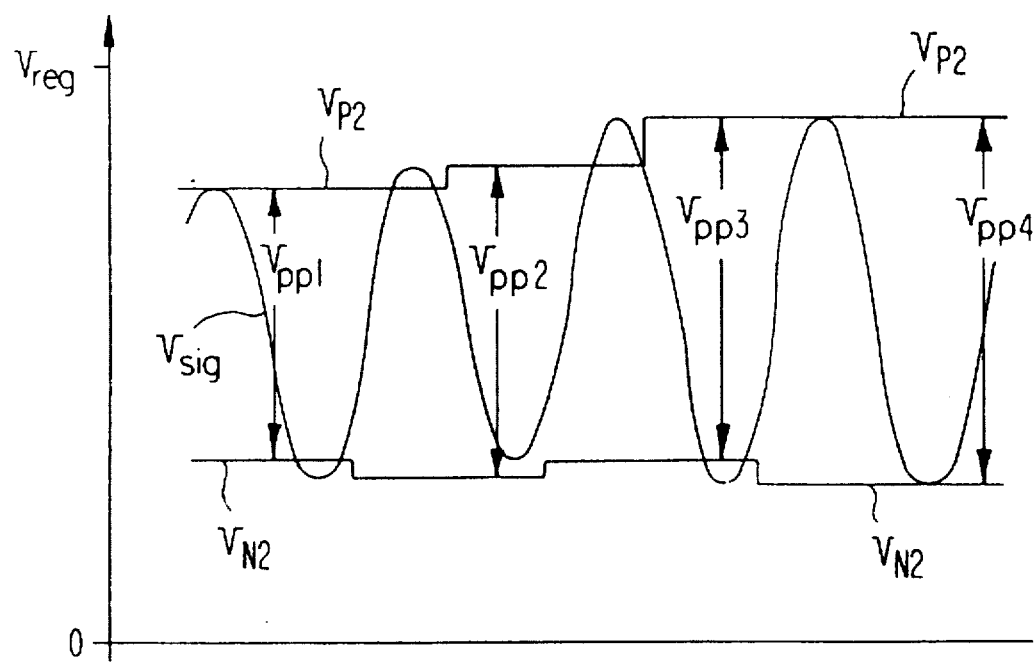
FIG. 9 shows a waveform of the Hall (transducer) voltage signal, during passage of a few magnetic articles, having superimposed thereon the corresponding output signals $V_{P2}$ and $V_{N2}$ from PDAC2 and NDAC2 in the proximity detector of FIG. 1.
Figure 10:
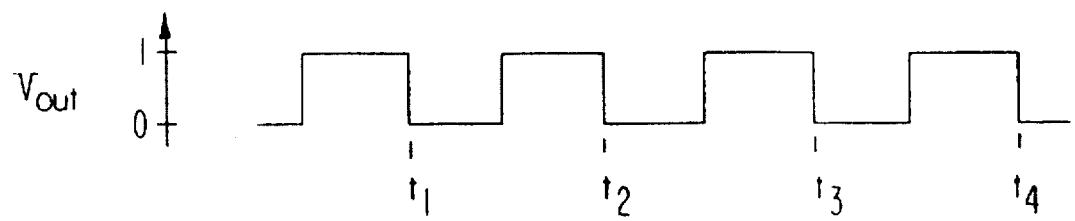
FIGS. 10, 11 and 12 are drawn to the same time scale as that of FIG. 9.

The count signals from counters 17 and 27 are also applied, via latches 42 and 52 respectively to PDAC2 44 and NDAC2 54. The P-latch 42 and N-latch 52 are enabled by signals $V_{Platch}$ (FIG. 7) and $V_{Nlatch}$ (FIG. 8) from one shot generators 41 and 51 respectively. The one shot generators 41 and 51 are triggered respectively by a low to high transition in the signal $V_{out}$ and by a high to low transition in $V_{out}$ (FIG. 4). The output signals $V_{P2}$ and $V_{N2}$ from PDAC2 and NDAC2 are shown in FIG. 9 as they relate to each other and to $V_{sig}$, and $V_{out}$ is drawn to the same scale in FIG. 10.

Now to recapitulate, the output of comparators 24 and 26 go high only when $V_{sig}$ goes negative. Thus only when $V_{sig}$ is going negative are there changes of state in the signals of AND gate 25, counter 27, NDAC1 30, latch 52, NDAC2 54 and buffer 58. The upper (P) and lower (N) portions of the circuit share the clock 18, the reset delay circuit 29. Referring to FIG. 3, this tracking of $V_{sig}$ begins at a time $t_{ppk}$ at which a low to high transition in $V_{out}$ occurs.

Counters 17 and 27 only count upwardly. It should be noted that the DC reference voltages $+V_{reg}$ and ground are connected to NDAC1 30 and NDAC2 54 inversely with =respect to those connections to PDAC1 20 and PDAC2 44; therefore as the count in counter 27 goes up, the output $V_{N1}$ of the NDAC1 30 goes down as seen in FIG. 3. Alternatively, both of the NDACS 30 and 54 could have been connected to the DC reference voltages as are the PDACs 20 and 44 if the counter 27 had been of the kind that counts down from maximum count. The counters 17 and 27 are of the kind that include an anti-overflow feature that prevents wrapping of the count when maximum count is exceeded.

The signals $V_{P2}$ and $V_{N2}$ are applied via unity gain buffer stages 48 and 58 to the two inputs of a fixed-gain differential amplifier 60. The output signal of amplifier 60, $V_{pp}$, is the difference voltage between $V_{P2}$ and $V_{N2}$, which difference voltage is essentially equal to the peak to peak value of $V_{sig}$. As $V_{sig}$ grows, it is tracked by $V_{pp}$ as seen in FIG. 9.

The signal $V_{pp}$ is applied to one input of a comparator 62. A reference voltage $V_{TG}$ is applied to the other comparator 62 input. When $V_{pp}$ exceeds $V_{TG}$ the output signal $V_{toobig}$ of comparator 62 is at a high binary level.

The Hall voltage amplifier 12 includes a fixed-gain amplifier stage 65; a programmable-gain amplifier composed of a digital-to-analog converter G-DAC 67, two resistors 71 and 73, and an operational amplifier 69; and a step-wise adjustable-gain amplifier composed of an operational amplifier 75; three resistors 77, 79 and 81, and a switch 83.

A counter 85 is an up counter which does not wrap after the maximum count is reached, and has a count output connected to the G-DAC 67. The signal $V_{out}$ is inverted by inverter 87, and counter 85 counts positive transitions in the inverted signal $V_{out}$. G-DAC 67 is connected internally as a digitally programmable resistor having a maximum resistance when the input count to the DAC is zero. The resistance of the resistor 71 in parallel with the resistance of G-DAC 67 sets the total input resistance to the operational amplifier 69 at its highest value at zero count which sets the gain of the amplifier at its lowest value.

Figure 11:
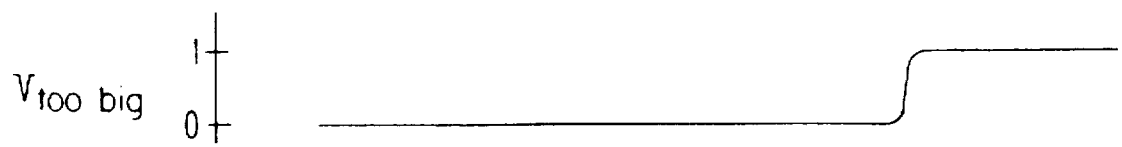
Figure 12:
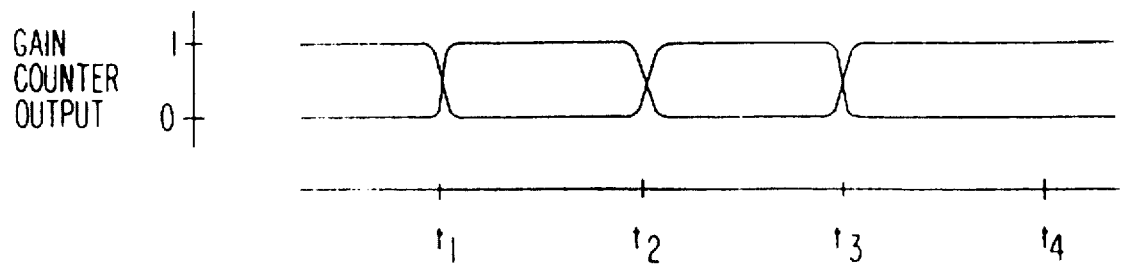

When the first positive and negative excursions in $V_{sig}$ generate a signal $V_{pp1}$ (FIG. 9) that is lower than the reference voltage $V_{TG}$, the signal $V_{toobig}$ is low (FIG. 11) and enables counter 85 via inverting NOR gate 89. Counter 85 responds by counting up by one count at the next positive transition in inverted signal $V_{out}$ as indicated in FIG. 12. This causes a single increment of gain increase, which is illustrated in FIG. 9 wherein $V_{pp1}$ grows to $V_{pp2}$ and $V_{sig}$ increases slightly in amplitude in the period from $t_1$ to $t_2$. This process of testing the amplitude of ($V_{pp}$ and thus $V_{sig}$) against a target reference value $V_{TG}$ and adjusting the gain upward one increment when the target has not yet been reached, continues for as many periods in $V_{sig}$ (and $V_{out}$) as is necessary to set the peak to peak amplitude of $V_{sig}$ to the target value, $V_{TG}$.

When the target value has been reached or exceeded, $V_{toobig}$ goes high (FIG. 11), so the counter 85 being thus disabled does not count further as illustrated in FIG. 12 and the gain of the amplifier remains fixed (e.g. between times $t_3$ and $t_4$ in FIG. 9) thereafter (until the detector has been turned off and started up again).

However, when the first positive and negative excursions in $V_{sig}$ generate a signal $V_{pp1}$ (FIG. 9) that is higher than the reference voltage $V_{TG}$, the signal $V_{toobig}$ is high for disabling counter 85 via inverting NOR gate 89, and holding the D input of the flip flop 91 high. Counter 93 is a serial counter that provides one output at which the signal is low until the counter has counted two (more generally a few) positive excursions in the inverted signal $V_{out}$, at which time the inverter 87 output goes high and clocks through the high at the D input of flip flop 91 to the flip flop Q output.

This clocking of a high signal through flip flop 91 occurs when the non inverted signal $V_{out}$ (FIG. 10) goes low. After the first two periods in $V_{sig}$, switch 83 closes to connect feedback resistor 81 which decreases the gain of the amplifier composed of operational amplifier 75 and resistors 77 and 79. For example, the operational amplifier gain may be reduced by a factor of 4, causing the gain of amplifier 12 to be reduced by a factor of 4.

Thus during the first two positive pulses in the transducer voltage $V_{sig}$ it is determined whether the peak to peak voltage of $V_{sig}$ ($V_{pp}$) is too big relative to the target reference voltage $V_{TG}$. If it is not too big, the G-counter is enabled (by signal $V_{toobig}$), the resistance of G-DAC 67 immediately begins to fall and the gain of that count controllable gain stage rises to the target value at which it remains thereafter.

But if during the first two positive pulses in the transducer voltage $V_{sig}$ (corresponding to the passing of two magnetic articles), it is determined that the peak to peak voltage ($V_{pp}$) of $V_{sig}$ is too big relative to the target reference voltage $V_{TG}$, then after two pulses in $V_{sig}$ the overall gain of amplifier 12 is reduced by a factor of 4, and the count-controllable gain stage brings the peak to peak value of $V_{sig}$ up to the target value.

Counter 93 is a serial up-counter of the kind that does not wrap. It counts up only and is not reset until de-energized and again energized. Counter 93 provides a second serial count output that goes high at the larger count of 16 excursions pulses) in $V_{sig}$ (or $V_{out}$). The x16 output is low until the count 16 has been reached. A high output signal from the x16 output of counter 93 at the count of 16 disables the G-counter 85 to limit how many (e.g. 16) periods in $V_{sig}$ (e.g. negative going excursions in $V_{sig}$ and/or $V_{out}$) may be counted by the G-counter 85 to adjust the gain. Alternatively, the counting of positive going excursions would be equally effective.

The purpose of effecting automatic gain adjustment, for only a few of the first pulses in $V_{sig}$ following turning on the supply voltage $+V_{reg}$ and starting the detection of passing articles, is to obtain optimum transducer-voltage amplifier gain for the conditions at staring and to maintain constant gain thereafter in order to avoid incremental shifts in the actual distance of approaching articles at which a corresponding transition in $V_{out}$ occurs. When gain changes take place continuously frequent shifts in detection approach distance cause jitter in the $V_{out}$ transitions.

In the above described embodiment, the gain of amplifier 12 is adjusted during the first 16 periods in $V_{sig}$ (corresponding to the passage of the first 16 magnetic articles) and thereafter held fixed, providing a fast initial gain adjustment after which no further adjustments are made. This feature is particularly suitable in a proximity detector for use in a combustion engine ignition system, wherein all the adjustments in gain occur only during crank start of the engine. During the subsequent loading and running of the engine it is desired to avoid any changes in ignition timing that would occur as a result of changes in the amplitude of $V_{sig}$, and thus gain adjust is completed just at start.

To summarize, after just two articles have passed it is determined whether the signal is too big and if so the gain of amplifier 12 is reduced by a large factor, namely in this example by a factor of 4. And during passage of the following 16 articles, the gain is adjusted upward based upon the greatest of the peak amplitudes in the transducer signal $V_H$, so that greatest peak amplitude is at a predetermined target value. This target amplitude is just inside the dynamic range of the amplifier 12, avoiding clipping of the signal while at the same time providing a large signal $V_{sig}$ with peaks just under the target value $V_{TG}$ for enhancing accurate detection.

Figure 13:
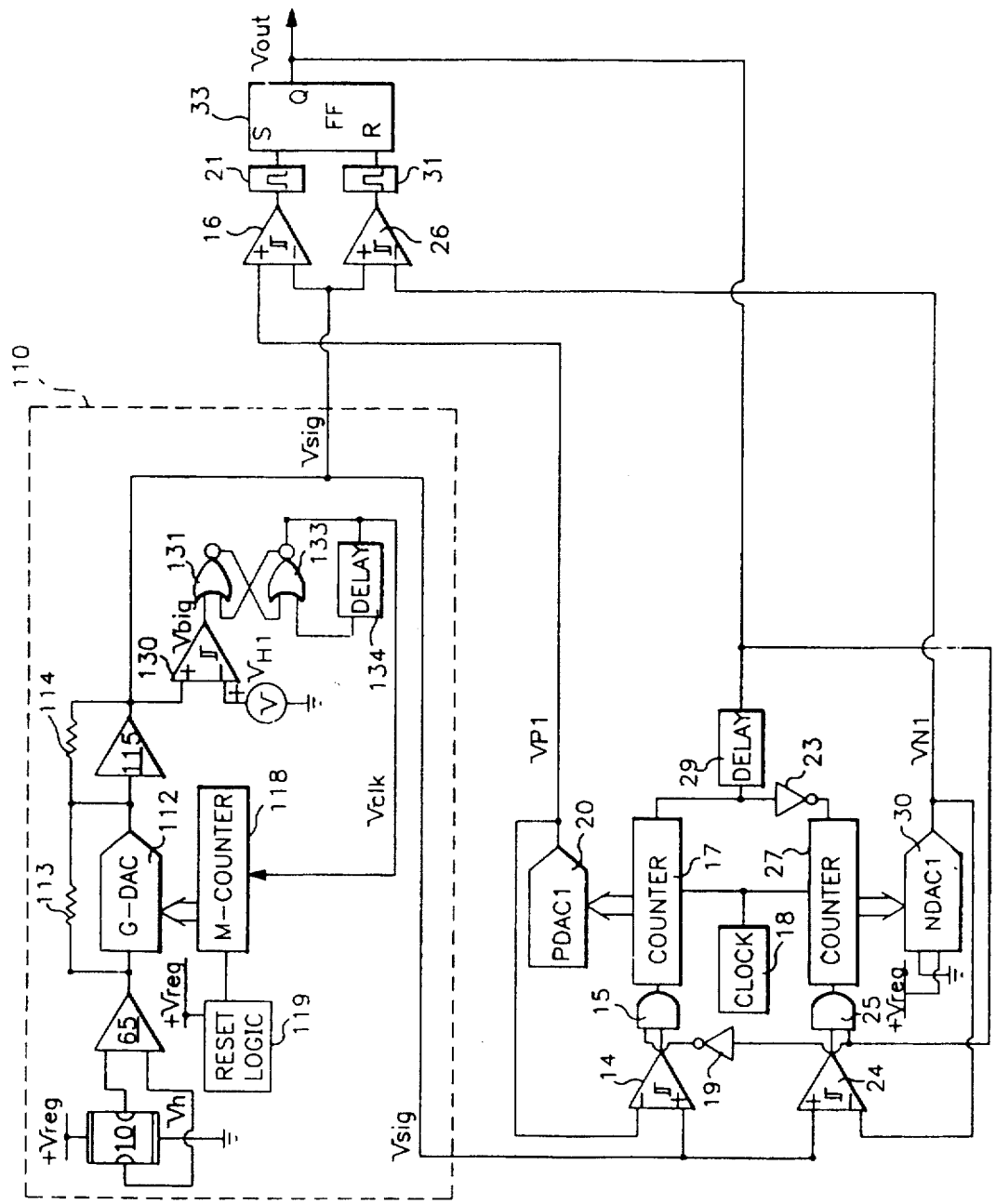
FIG. 13 shows a block diagram of a second magnetic-article proximity detector.

Referring to the second embodiment of a gain controlled proximity detector in FIG. 13, the output of the Hall transducer 10 is connected to the fixed-gain Hall voltage amplifier 65 which is in turn connected to the input of a digitally controllable gain stage composed of a digital-to-analog converter G-DAC 112, two resistors 113 and 114, and an operational amplifier 115.

The counter 118 is a down counter which is reset to its maximum count by logic block 119 only when the proximity detector is started, namely when $+V_{reg}$ is turned on. Counter 118 does not wrap after the unlikely event that the count has reached zero. The positive going transitions in clock signal Vclk correspond respectively to passage of magnetic articles by the transducer 10 as will be further described.

G-DAC 112 is connected internally as a digitally programmable resistor having a maximum resistance when the input count to the DAC is zero. This G-DAC resistor in parallel with resistor 113 sets the total input resistance $R_{in}$ to the operational amplifier 69 at its highest value when the counter 118 is at maximum count. The gain of this digitally controlled amplifier is $R_{114}/R_{in}$, and at maximum count when $R_{in}$ is at its minimum value the amplifier gain is the greatest.

Figure 14:
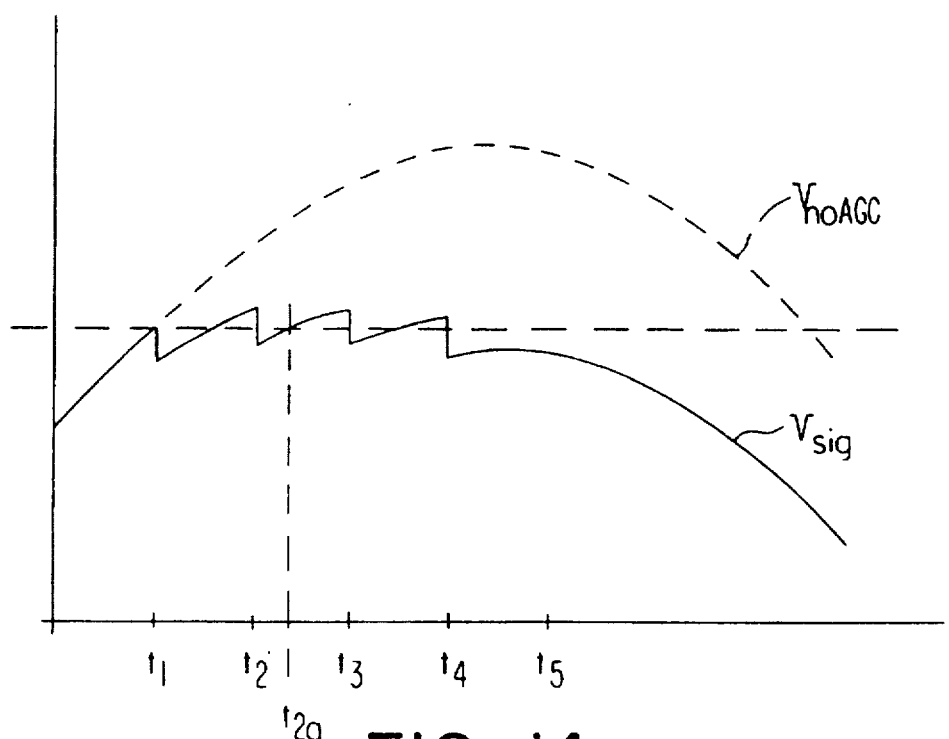
FIGS. 14, 15, 16, 17 and 18 relate to the proximity detector of FIG. 13 and are all drawn to the same time scale.

The amplified Hall voltage $V_{sig}$ is applied to one input of comparator 130 and a DC reference voltage $V_{HI}$ is connected to the other input of comparator 130. When as illustrated in FIG. 14, a positive excursion in $V_{sig}$ reaches the reference voltage $V_{HI}$, the signal $V_{big}$ (FIG. 15) at the output of comparator 130 goes high at time $t_1$. This causes the output Vclk (FIG. 16) of the latch of cross-coupled NOR gates 131 and 133 to go high, and the count in counter 118 decreases by one. Thus at $t_1$ the resistance of G-DAC 112 goes up by an incremental amount, the gain of amplifier 110 decreases by a corresponding incremental amount and there is an incremental drop in the voltage $V_{sig}$ that occurs at time $t_1$.

Figure 15:
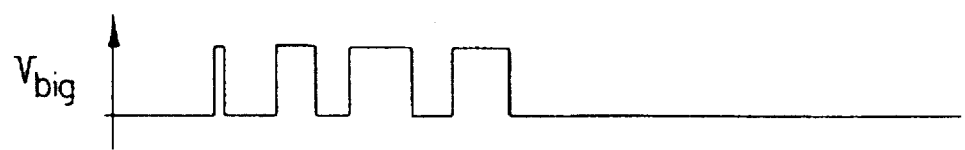
Figure 16:
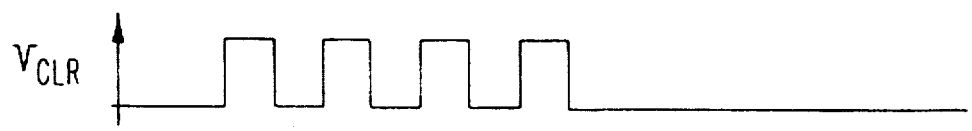
Figure 17:
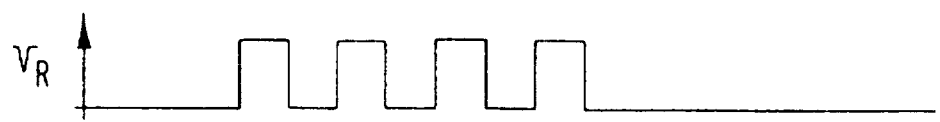

But the incremental drop in $V_{sig}$ at $t_1$ puts the amplitude of $V_{sig}$ below $V_{HI}$ and Vbig almost instantaneously goes low as illustrated in FIG. 15. Thus there is only a narrow high spike in the signal Vbig at $t_1$ as seen in FIG. 15. The signal Vclk passes through the delay circuit 134 (e.g. a 5 μsec delay), and at 5 μsec after $t_1$ the reset input signal $V_R$ (FIG. 17) to NOR gate 133 goes high to reset the NOR gates latch.

Because the gain in amplifier 110 has dropped at $t_1$, $V_{sig}$ is amplified less after $t_1$. When $V_{sig}$ again reaches $V_{HI}$, Vbig goes high. But the high in $V_R$ (FIG. 17) holds the latch reset until $t_2$, at which time the high in Vbig can set the latch again and drop the gain of the amplifier 110 a second time. This sequence of events is repeated until at time $t_4$, $V_{sig}$ remains below the reference voltage $V_{HI}$. The dashed curve $V_{noAGC}$ in FIG. 14 shows the waveform of the excursion of $V_{sig}$ that would have occurred if the gain of the amplifier 110 had remained constant, i.e. there had been no automatic gain control.

Figure 18:
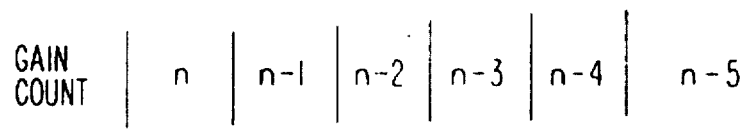

In FIG. 18, n is the gain setting count in counter 118 prior to time $t_1$. Successive counts (n-1) through (n-5) decrease leading to successive decreases in amplifier gain. If the following positive peaks in transducer signal $V_H$ remain the same, the gain setting count in counter 118 will drop very little more if any. It can therefore be appreciated that AGC action will have been substantially terminated during appearance of the very first positive excursion in $V_{sig}$ after energizing the proximity detector.

This also illustrates the ability of the detector of FIG. 13 to count passing magnetic articles down to zero speeds and simultaneously obtain effective AGC action and the corresponding advantage of high detection accuracy from the very first positive excursion in $V_{sig}$.

Figure 19:
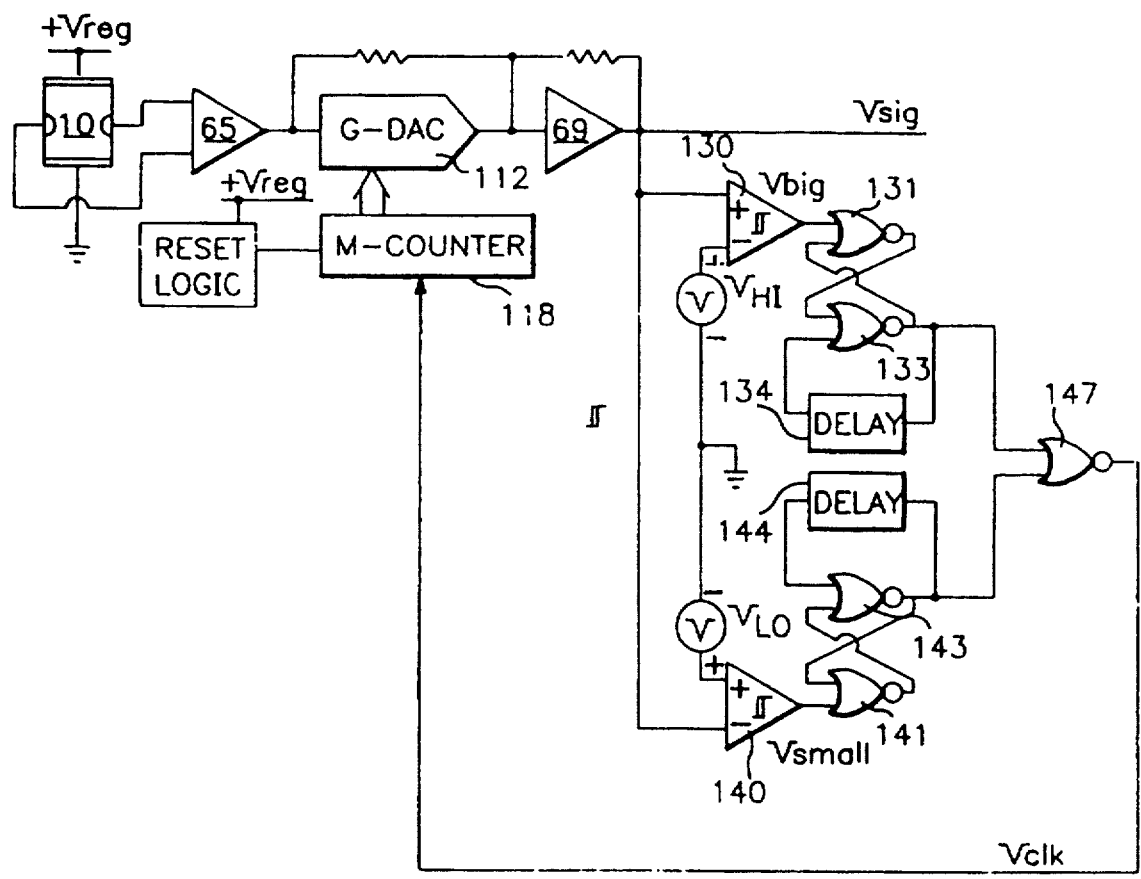
FIG. 19 shows a block diagram of an alternative AGC circuit to that employed in the proximity detector of FIG. 13.

The detector of FIG. 19 consists of the detector of FIG. 13 with the addition of AGC circuits for automatic gain control of a negative going excursion in $V_{sig}$. Although, considering that the detector of FIG. 13 controls the gain of $V_{sig}$ and therefore the amplitude of positive and negative peaks therein, and considering that it is not uncommon that magnetic-field-to-voltage transducers produce asymmetrical waveforms in $V_H$, it will be appreciated that it is possible in the detector of FIG. 13, with AGC based on positive peaks only in $V_{sig}$, that negative peaks would be clipped.

The AGC circuit is expanded in FIG. 19 to additionally include a negative peak comparator 140, a new fixed DC reference voltage generator $V_{LO}$, another latch of cross-coupled NOR gates 141 and 143, and another delay circuit 144.

These additional components are to provide complementary treatment of gain adjust referenced to the negative going excursions in $V_{sig}$. The added NOR gate 147 has inputs connected to the outputs of the two cross-coupled latches and produces a composite clock signal Vclk that is applied to the input of the down counter 118. Now if the first positive excursion in $V_{sig}$ is greater than $V_{HI}$, the gain is adjusted downward. If a subsequent negative going excursion in $V_{sig}$ is still less than $V_{LO}$, the gain is downward adjusted so that the peaks of both polarities in $V_{sig}$ are within the range of from $V_{LO}$ to $V_{HI}$, and asymmetrical waveforms in $V_H$ of any extreme are quickly brought within the dynamic operating range of the amplifier by the AGC circuit of FIG. 19.

Figure 20:
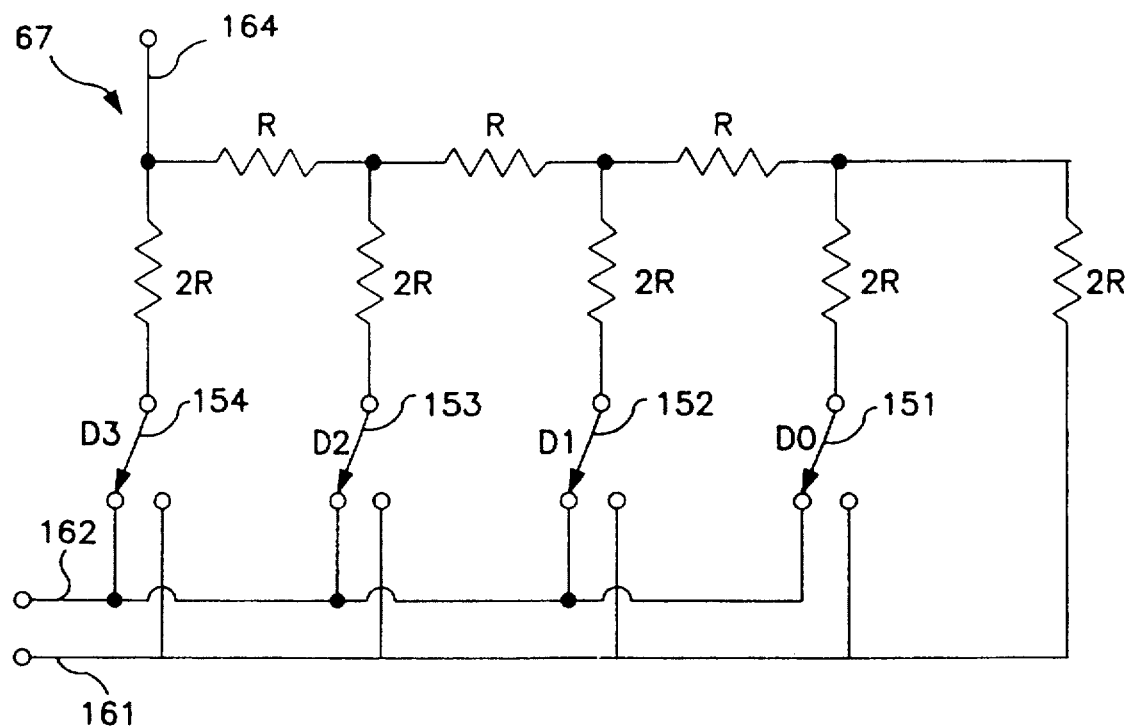
FIG. 20 shows a circuit diagram of an R/2R digital-to-analog converter (DAC).
Figure 21:
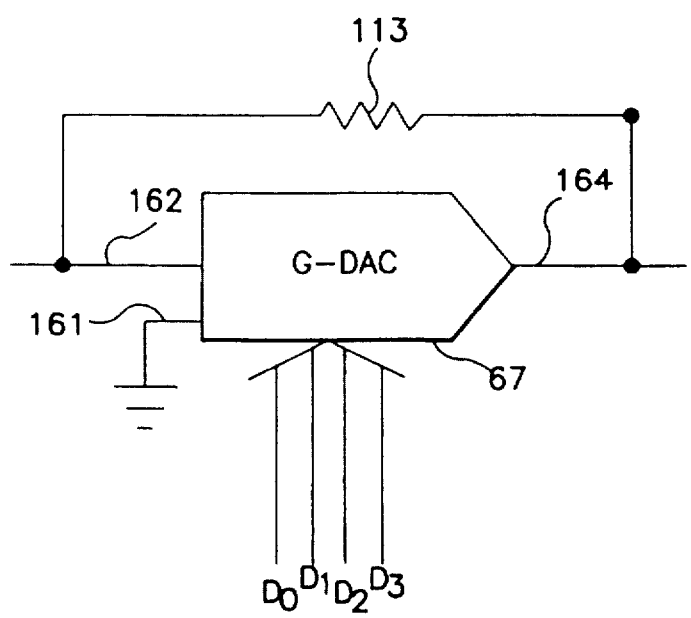
FIG. 21 shows a block diagram 67 of the DAC of FIG. 20 connected as a digitally controllable resistor, such as may be employed as the G-DAC 85 in FIGS. 1 and 19, and as the G-DAC 112 in FIG. 13.

The DACs 67 and 112 in FIGS. 1, 13 and 19 serve essentially as digitally-controllable resistors, and may employ the well known 2R/R type DACs connected as shown in FIG. 20. Each of the three resistors shown at the top of FIG. 20 has a resistance R, while the other four resistors have a resistance of 2R. The corresponding external leads of DAC 67 are shown both in the full circuit of FIG. 20 and the block diagrammed DAC 67 in FIG. 21.

A lead 161 is grounded while leads 162 and 164 are connected respectively to the output of the first Hall-voltage amplifier 65 and to the input of the operational amplifier 69. The four switches 151, 152, 153 and 154 represent electronic switches to which are connected the four digit count signal $D_0$, $D_1$, $D_2$ and $D_3$ from the gain counter (e.g. 85). Switches 151, 152, 153 and 154 are shown in the positions wherein all four digits in the input count signal are high and the resistance between leads 162 and 164 is at a minimum value. The paralleling resistor 113 is not essential. Resistor 113 drops the minimum resistance of the paralleled combination at the input of the operational amplifier but more importantly reduces the maximum operational amplifier input resistance, i.e. maximum $R_{in}$.

When grounded the G-DACs become digitally-controllable voltage dividers, and the effective resistance between conductors 162 and 164 becomes essentially a linear function of the digital count to the G-DAC 67 when R is large enough that the resistance between terminals 161 and 162 is much larger than the output impedance of the Hall-voltage amplifier 65. Thus amplifier gain is a linear function of the count.

Many variations in the proximity detectors described herein now evident, some of which are as follows.

It will be recognized that during the tacking by $V_{P1}$ of positive slope portions of $V_{sig}$ by the proximity detector of FIG. 1, the comparator 14, clock 18, counter 17 and PDAC1 20 serve together as a generator of a digital signal, namely the digital count signal at the output of the counter 17, that is tracking $V_{sig}$. This digital signal generator is a digitizer of the analog signal $V_{sig}$, or is an analog-to-digital convertor. Likewise during tracking by $V_{N1}$, comparator 24, clock 18, counter 27 and NDAC1 30 serve together as an analog-to-digital convertor producing a digital signal, namely the digital count signal at the output of the counter 27, that tracks negative going portions of $V_{sig}$. These remarks apply to FIG. 13 as well. In proximity detectors described herein, digital-to-analog convertors may be formed by circuit means other than those shown here.

For example, the digitally-gain-controllable amplifiers based upon use of G-DACs 67 and 112 may alternatively be based upon prior art digitally-gain-controlled amplifiers wherein there is substituted for the G-DAC a group of parallel connected branch circuits, each containing a resistor and a binary-signal controllable switch.

It is further possible to employ just one up-down counter (instead of the up counters 17 and 27) that would count up and down in response to a high binary signal respectively from comparators 14 and 24. In this case only one DAC, e.g. PDAC1 20, may be used with the output connected to the positive and negative inputs respectively of comparators 16 and 26. The circuit portion in FIG. 1 for generating the signal $V_{toobig}$ may then be modified by connecting the up-down counter output to both latches 42 and 52, and enabling these latches during up counting and down counting respectively, e.g. using the signal $V_{out}$ as a latches enabling signal.

As noted, the purpose of effecting automatic gain adjustment, for only a few of the first pulses in $V_{sig}$ to avoid incremental shifts in the actual distance of approaching articles at which a corresponding transition in $V_{out}$ occurs. In applications such as ignition distributors, the timing of engine firing tends to cause small but annoying jumps in engine power delivery. However, when detection accuracy is an overriding consideration, it is easily possible to periodically reset counter 93 (FIG. 1) or 118 (FIG. 13) to permit infrequent readjustments in gain, e.g. every minute or so, or after a predetermined number of detected articles have passed by.

Of course continuous gain adjustment is another option, e.g. accomplished in the detector of FIG. 1 by removing the NOR gate 89 and connecting the Vtoobig signal directly to the enable input of the counter 85.

The Hall-amplifier output voltage $V_{sig}$ may be considered a magnetic-field-to-voltage transducer output, which transducer includes the Hall element. The above-described AGC is effected by controlling the gain of a digitally controlled Hall-amplifier that may be considered part of a transducer. Alternatively, it is possible to digitally control the exciting current in the Hall element for effecting AGC of the composite transducer, e.g. by using a digitally controlled voltage regulator that is used for energizing the Hall element.

It has been found through computer generated models, that proximity detectors of the kind described in the above-mentioned co-filed patent application Ser. No. 08/587,405 entitled DETECTION OF PASSING MAGNETIC ARTICLES AT SPEEDS DOWN TO ZERO which issued on Mar. 17, 1998 as U.S. Pat. No. 5,729,130 may advantageously be merged with those of the kind described in patent application Ser. No. 08/587,407 entitled DETECTION OF PASSING MAGNETIC ARTICLES WHILE PERIODICALLY ADAPTING DETECTION THRESHOLDS TO CHANGING AMPLITUDES OF THE MAGNETIC FIELD which issued on Jul. 22, 1997 as U.S. Pat. No. 5,650,719.

Labeling these two kinds of proximity detectors respectively as "slope-activated" and "threshold" proximity detectors, a slope-activated detector was advantageously merged in a computer modeling simulation with a threshold detector. In the model, the merged detector became operative in the slope-activated mode for a short initial interval after starting, after which it automatically went into the threshold detection mode.

Furthermore the automatic gain control feature, that is described herein and is capable of operation down to zero speeds, was incorporated with the slope-activated detector for only initially setting the gain and the level of $V_{sig}$. Automatic gain control was thereafter discontinued to avoid further step-function gain shifts which tend to cause jitter and instability in the detection distances of magnetic article approach and departure. The method of automatic gain control described herein is especially well suited for such initial use in a merged proximity detector because of its rapid gain adjustment and its undiminished detection efficacy at very low speeds.

Figure 22:
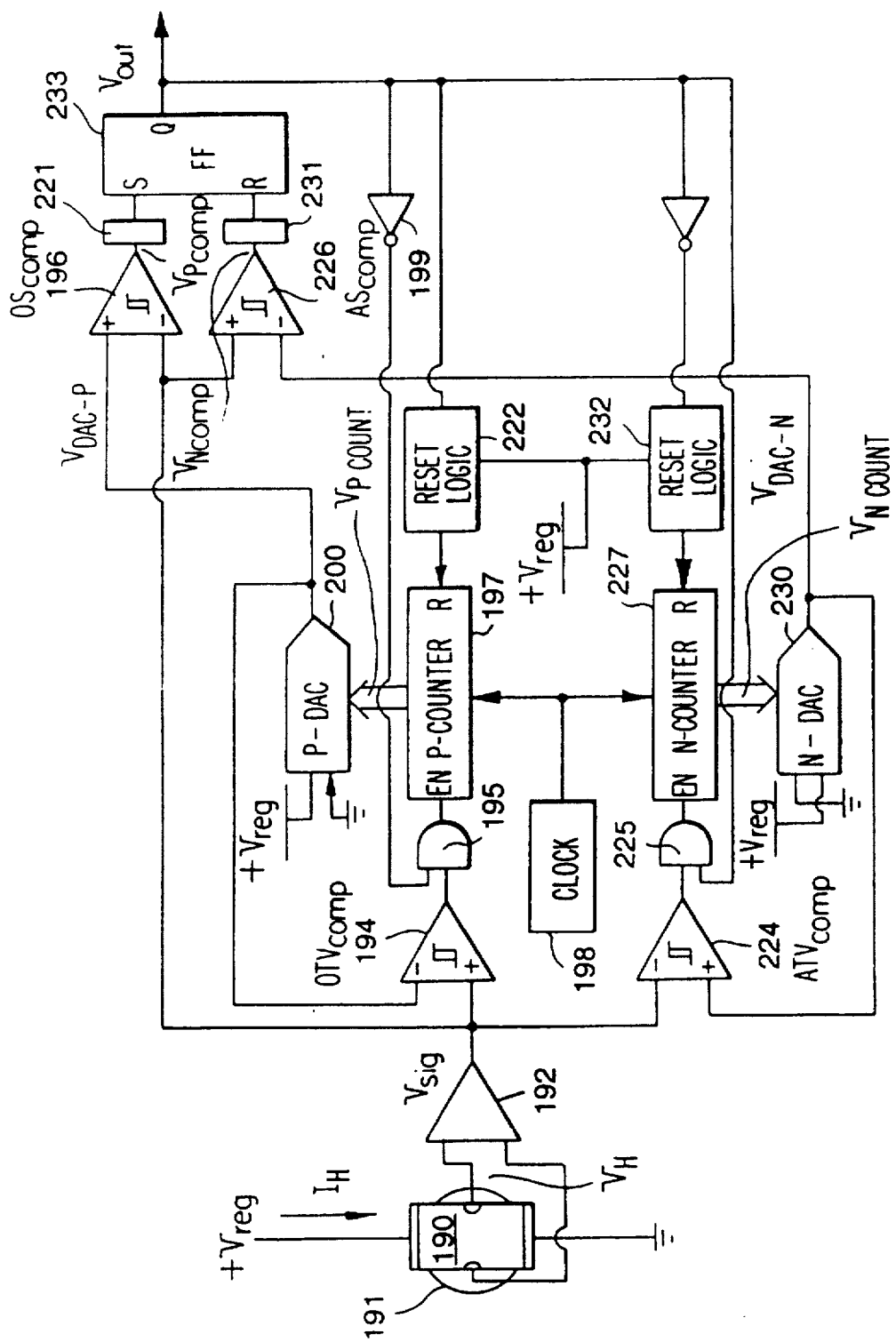
FIG. 22 shows a block diagram of a first magnetic-article proximity detector.

Referring now to FIG. 22, a Hall element 190 is energized by a current $I_H$ and has an output connected to the input of a Hall voltage amplifier 192. Hall element 190 is mounted at a pole of a magnet 191, so that when a ferrous article approaches, the Hall voltage $V_H$ and the amplified Hall voltage $V_{sig}$ increase (or decrease); and when the article recedes, $V_H$ and $V_{sig}$ decrease (or increase depending on the polarity of the magnet pole).

Alternatively, the sensor circuit of FIG. 22 may be used to detect magnetic articles that themselves are magnetized, in which case the Hall element need not be mounted adjacent a magnet, e.g. the magnet 191.

A magneto resistors bridge (not shown) may be substituted for the Hall element. And two Hall elements with their outputs connected differentially to the input of the Hall voltage amplifier (not shown) represents a second alternative magnetic-field to-voltage transducer.

The amplified Hall voltage $V_{sig}$ is manipulated by the remaining circuits in the proximity detector of FIG. 22 to produce an output logic signal, $V_{out}$, having a profile that reflects the profile of the passing articles. This is partially accomplished by tracking the positive going portions of $V_{sig}$ and detecting the next positive peak, which function is implemented by an upper portion of the circuit in FIG. 22. This upper portion of the circuit and its function will be described first.

The amplified Hall voltage $V_{sig}$ is applied to the negative input of a first comparator 194 via AND gate 195, and also is applied to the negative input of a second comparator 196. When the output of the first comparator 194 goes high the P-counter 197 begins counting the clock pulses from clock 198. The resulting count signal, $V_{Pcount}$, is presented to the digital-to-analog converter (DAC) 200 which produces an output analog voltage $V_{DAC-P}$ lying within the range from zero to the applied DC voltage, $+V_{reg}$. Thus, at any instant the amplitude of $V_{DAC-P}$ is a direct linear function of the applied count signal.

When power is first applied to the detector circuit, logic block 222 senses the time of turning on of the DC supply voltage, $+V_{reg}$, and resets the counter to zero count at startup.

The comparator 194 has a small hysteresis and so is a Schmitt type comparator. The output of the DAC 200 is connected to the negative input of the comparator 194 so that whenever $V_{sig}$ is greater than voltage $V_{DAC-P}$ plus the small hysteresis threshold voltage of the Schmitt comparator 194, then the comparator 194 output is high and the P-counter 197 is enabled and counting. When $V_{sig}$ is growing more positive, $V_{DAC-P}$ is caused to track $V_{sig}$ in stair step fashion, as is illustrated in FIG. 23. The incremental vertical excursions of the stair stepped $V_{DAC-P}$, $\tau$, are equal to the least significant bit of the DAC (in millivolts) while the incremental horizontal times $\Delta t1$ increase as the slope of $V_{sig}$ decreases. The hysteresis threshold of Schmitt comparators 194 and 224 are smaller than the incremental excursions respectively in $V_{DAC-P}$ and $V_{DAC-N}$, so have no effect on the size of those excursions.

When the peak voltage of $V_{sig}$ is reached, the P-counter 197 stops counting and $V_{DAC-P}$ holds this peak voltage Vpk until time $t_{ppk}$. At time $t_{ppk}$, $V_{sig}$ has dropped below the peak held voltage by an amount equal to the threshold voltage, Vhys, of the second Schmitt type comparator 196. At time $t_{ppk}$ the output of the second comparator 196 $V_{pcomp}$ briefly goes high, as seen in FIG. 24 and sets the flip flop 233 causing the Q output of flop 233 to go high as seen in FIG. 25.

The Q output of comparator 233 is connected to the reset input of the P-counter 197 via logic block 222. Logic block 222 generates a reset pulse that resets the counter 197 to zero count, only at the occurrence of a low-to-high transition in the signal $V_{out}$. This causes the output voltage of the DAC, $V_{DAC-P}$, to drop to zero volts which terminates the high output pulse in the signal $V_{pcomp}$.

This comparator output pulse, $V_{pcomp}$, tends to be very narrow and it may be desirable to employ a logic block 221 in the connection from the output of the second comparator 196 to the input of the flip flop 233 for increasing the pulse width toward providing greater reliability of the logic functions.

FIGS. 26 and 27 show the repetitive nature of the output signal $V_{sig}$ that follows in a gear tooth sensing application, wherein the positive peaks in $V_{sig}$ may correspond to the passing of successive gear teeth, and a pulse appears in the comparator output voltage $V_{pcomp}$ just after each occurrence ($t_{ppk}$) of a positive peak voltage in $V_{sig}$, and in each such successive instant the signal $V_{out}$ goes high.

At each such occurrence ($t_{ppk}$), it is necessary to disable the P-counter 197 to keep it inactive during the subsequent negative slope portion of the amplified Hall voltage $V_{sig}$. This is accomplished by connecting the output of flip flop 233 to the second input of AND gate 195 via inverter 199.

$V_{sig}$ is shown in FIGS. 23 and 26 as having broad peaks to provide a clear picture of the relationship between $V_{sig}$ and $V_{DAC-P}$. In most practical situations, the magnetic articles to be detected have a geometry and a path of approach to the Hall element so that the Hall voltage $V_H$ and $V_{sig}$ have a more nearly square waveform than the broadly rounded peaks signal $V_{sig}$ shown in FIGS. 23 and 26.

For the more typical flat topped $V_{sig}$ signal (not shown), the counter reset time $t_{ppk}$ By occurs essentially at the end of the peak in the amplified Hall voltage, $V_{sig}$, which corresponds to the beginning of the ensuing downward slope of $V_{sig}$, which for example may further correspond to the beginning of a trailing edge of a passing gear tooth.

In a prior art slope-activated detector, as the speed or rate of the passing magnetic articles goes lower and lower, in a fixed time scale $V_{sig}$ appears more and more rounded (since it cannot have been perfectly square) to the point where the rate of decay in the held peak voltage approaches the slope of $V_{sig}$ just after a peak. In a prior art detector, this slow speed condition results in the difference signal at the comparator input not being able to exceed the hysteresis of the comparator and no output pulses are generated at low speeds.

On the other hand, the P-counter 197 holds a count at the peak which causes the DAC 200 to hold the peak voltage indefinitely, waiting even hours or days, until the difference in the two signals $V_{sig}$ and $V_{DAC-P}$ reaches Vhys, and thus enabling detection right down to a zero rate of passing articles.

The above description is to of a part of the proximity detector circuit (FIG. 22) that tracks and holds the peak of positive going (positive slope) portions of the amplified Hall voltage signal, $V_{sig}$.

That description is yet missing the means for (a) terminating a time interval after $t_{ppk}$ in which the P-counter 197 is disabled, and for (b) changing $V_{out}$ from high to low again.

These functions depend upon the yet to be described part of the proximity detector of FIG. 22 which also tracks and holds the negative going (negative slope) portions of the amplified Hall voltage signal, $V_{sig}$.

In the dual polarity detector of FIG. 22, the negative going portions of $V_{sig}$ are tracked and held at the negative peaks by the additional components: a first comparator 224, AND gate 225, Ncounter 227, DAC 230, pulse expander circuit 231, and second comparator 226. These components are functionally complimentary to the above-described components, respectively the first comparator 194, AND gate 195, counter 197, DAC 200, pulse expander circuit 221, and second comparator 196, which track and hold the peak of the positive going portions of $V_{sig}$.

The negative input of first comparator 224 is connected to the output of Hall voltage amplifier 192. Logic block 232 generates a reset pulse that resets the N-counter 227 to zero count, only at the occurrence of a high-to-low transition in the signal $V_{out}$.

Figure 28:
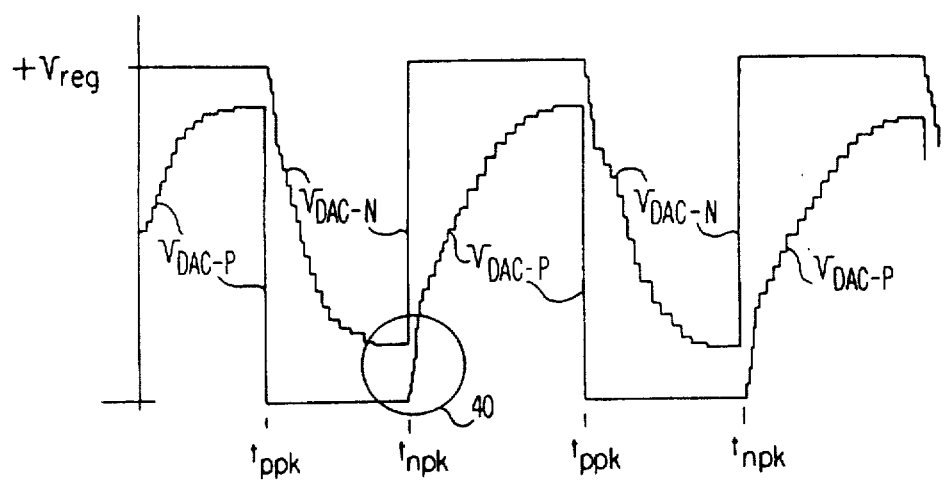
FIG. 28 shows the waveform of $V_{DAC-P}$ and $V_{DAC-N}$ which respectively track and hold $V_{sig}$. ($V_{sig}$ is not shown in the interest of clarity.)
Figure 29:
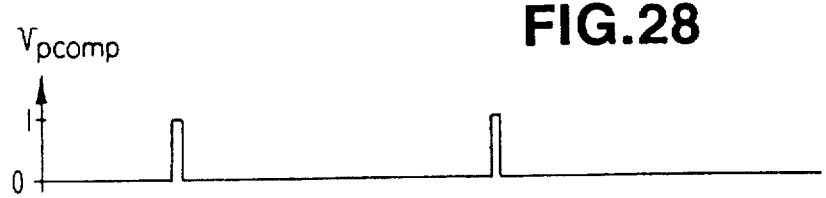
FIGS. 29 and 30 show respectively the signals $V_{pcomp}$ and $V_{ncomp}$, which are drawn to the same time scale as FIG. 28.
Figure 30:
Figure 31:
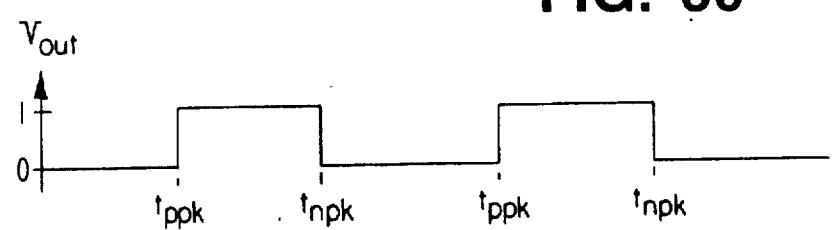
FIG. 31 shows the waveform of the output voltage signal, $V_{out}$, in the proximity detector of FIG. 22 and is drawn to the same scale as are the waveforms of FIG. 28.
Figure 32:
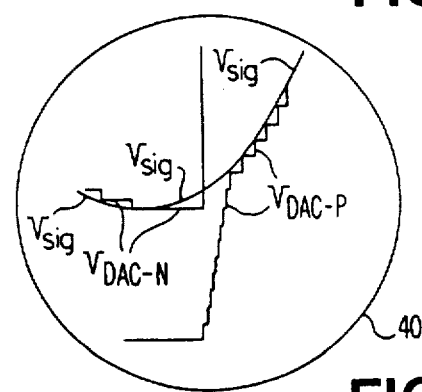
FIG. 32 shows an enlarged view of the detail 40 in the waveforms of FIG. 28.

The performance of the dual peak detecting proximity detector of FIG. 22 is indicated in FIGS. 28 through 32. In FIG. 28, $V_{DAC-P}$ is shown tracking $V_{sig}$ during positive slope portions of $V_{sig}$. For clarity, the amplified Hall signal, $V_{sig}$, is not drawn in here. $V_{DAC-N}$ is shown tracking $V_{sig}$ during negative slope portions of $V_{sig}$.

The output signal, $V_{out}$, (FIG. 31) is a square wave that is low during times when the amplified Hall voltage, $V_{sig}$, has a positive slope and is high when the amplified Hall voltage, $V_{sig}$, has a negative slope.

$V_{out}$ is thus a slope-polarity indicator and is applied directly to an input of the AND gate 195 to enable counting of N-counter 227 only during times when the slope of $V_{sig}$ is negative and at negative peaks. On the other hand, $V_{out}$ is applied to an input of the AND gate 195 through inverter 199 to enable counting P-counter 197 only during times when the slope of $V_{sig}$ is positive and at positive peaks. The output signal of the second comparators 226 is connected to the set inputs of flip flop 233.

The proximity sensor of FIG. 22 provides dual polarity peak detection leading to the capability for generating a square-wave output signal, $V_{out}$, having a profile that corresponds to that of passing gear teeth and the like. A peak detecting proximity detector of including essentially the same construction and operation is described in somewhat different terms in the patent application, Ser. No. 08/587,407, entitled DETECTION OF PASSING MAGNETIC ARTICLES WHILE PERIODICALLY ADAPTING DETECTION THRESHOLDS TO CHANGING AMPLITUDES OF THE MAGNETIC FIELD which issued on Jul. 22, 1997 as U.S. Pat. No. 5,650,719. Another patent application Ser. No. 08/587,406, entitled DETECTION OF PASSING MAGNETIC ARTICLES WITH AUTOMATIC GAIN CONTROL which issued on Dec. 2, 1997 as U.S. Pat. No. 5,694,038 describes a similar analog-to-digital convertor followed by an analog to digital convertor for tracking and holding V.,9. These two applications are assigned to the same assignee, and are incorporated herein by reference to provide a fuller description.

Figure 33:
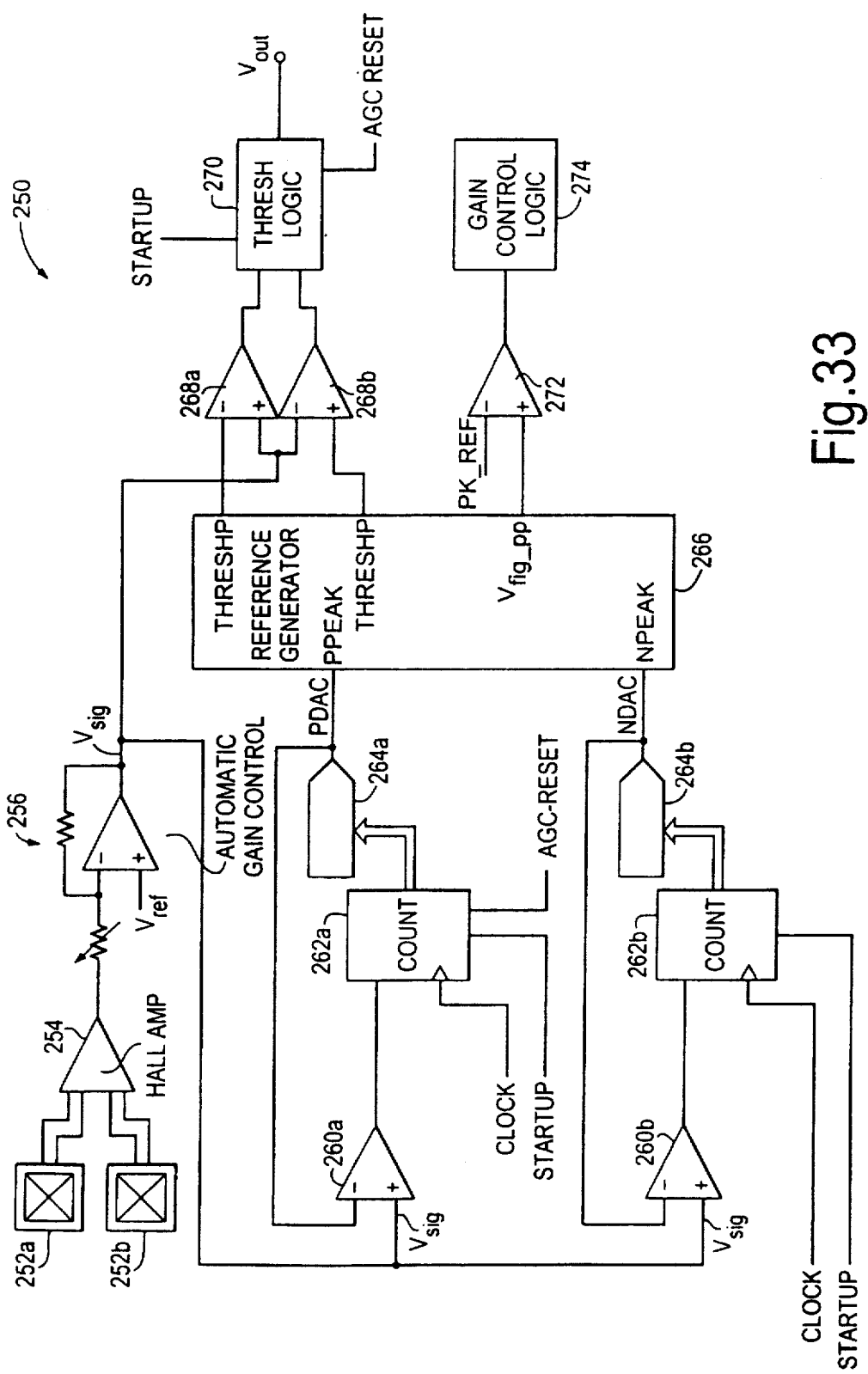
FIG. 33 is a block diagram of a proximity detector which includes a peak-to-peak percentage threshold detector having a threshold logic circuit which allows the proximity detector to start in peak-to-peak percentage threshold mode and to operate in AGC mode.

Referring now to FIG. 33, a magnetic article proximity detector 250 capable of initially starting in a peak-to-peak percentage threshold detection mode includes a pair of Hall elements 252a, 252b connected differentially to the input ports of a Hall amplifier 254. Hall elements 252a, 252b convert a differential magnetic field into electrical signals which are provided to input ports of an amplifier 254 as shown.

In this particular embodiment, the two Hall elements 252a, 252b are shown. Those of ordinary skill in the art will appreciate, however, that the two Hall elements 252a, 252b may equivalently be replaced by a single Hall element. Alternatively still, Hall elements 252a, 252b may be replaced by a magneto resistive bridge .

An amplified signal is coupled from an output port of amplifier 254 to a first port of an optional automatic gain control circuit (AGC) 256. A second input port of AGC 256 is coupled to a reference signal voltage $V_{REF}$ and AGC 256 provides a signal voltage $V_{sig}$ at an output port thereof. The amplitude of signal voltage $V_{sig}$ varies in accordance with the strength of the magnetic field detected by Hall elements 252a, 252b.

AGC circuit 256 amplifies the signal provided thereto with a gain which varies in accordance with one of a plurality of available AGC algorithms such that the peak-to-peak signal amplitude of the signal voltage $V_{sig}$ remains substantially constant over a relatively wide range of air gaps between the Hall elements 252a, 252b and the magnetic article detected by the Hall elements. It should be noted that AGC 256 is not required to allow proximity detector circuit 250 to initially begin operation in peak-to-peak percentage threshold detection mode.

The AGC 256 provides the signal voltage $V_{sig}$, to positive input ports of a first pair comparators 260a, 260b. Outputs of comparators 260a, 260b are coupled to respective ones of counter circuits 262a, 262b. Counter circuits 262a, 262b are each coupled to receive a clock signal CLK and a startup signal STARTUP.

Comparator 260a, count circuit 262a and DAC 264a form a first tracking circuit which receives the signal voltage, $V_{sig}$, and generates at an output port thereof a signal voltage PDAC, that tracks the highest peak of the signal voltage $V_{sig}$. Similarly, comparator 260b, count circuit 262b and DAC 264b form a second tracking circuit which also receives the signal voltage, $V_{sig}$, and generates at an output port thereof a signal voltage NDAC, that tracks the lowest peak of the signal voltage $V_{sig}$.

The PDAC and NDAC signal voltages are coupled from the output ports of the respective ones of the first and second tracking circuits to a reference generator circuit 266. Reference generator 266 includes a resistor divider coupled between the output ports of the DACs 264a, 264b. Thus the signal voltages PDAC and NDAC are coupled to the resistor divider to generate signal threshold voltages THRESHP and THRESHN in reference generator circuit 266.

The threshold signal voltages THRESHP and THRESHN are coupled to respective first inputs of respective threshold comparators, 268a, 268b. The signal voltage $V_{sig}$ is coupled to the other inputs of comparators 268a, 268b.

The output ports of threshold comparators, 268a, 268b are coupled to respective input ports of a forcing circuit 270. In response to one of a signal STARTUP and a signal AGC_RESET, forcing circuit 270 forces output signal voltage $V_{out}$ to a predetermined value and maintains the output signal voltage $V_{out}$ at the predetermined value to prevent the output from false switching during an initial startup interval of the proximity detector 250 and when the proximity detector 250 engages the AGC.

Reference generator 266 also generates a signal $V_{sig\_pp}$ which is coupled to an input of comparator 272. A second signal voltage PK_REF is coupled to a second input of comparator 272. An output of comparator 272 is coupled to a gain control logic circuit 274 which determines when AGC should occur.

Proximity detector 250 operates in the following manner. At initial startup, the signal STARTUP is provided to count circuits 262a, 262b and forcing circuit 270. In response to the signal STARTUP, count circuit 262a sets the output of DAC 264a to a value which is lower than the least positive expected value of the signal voltage $V_{sig}$ such as a voltage level close to or equal to the negative rail voltage for example. Similarly, in response to the signal STARTUP, count circuit 262b sets the output of DAC 264b to a value which is greater than the least negative expected value of the signal voltage $V_{sig}$ such as a voltage level close to or equal to the positive rail voltage for example.

Setting the DAC 264a to a value which is lower than the least positive expected value of the signal voltage $V_{sig}$ ensures that the DAC 264a will capture the positive peak of the signal $V_{sig}$ even if the signal $V_{sig}$ includes a relatively large offset voltage. Similarly, setting the DAC 264b to a value which is greater than the least negative expected value of the signal voltage $V_{sig}$ ensures that the DAC 264b will capture the negative peak of the signal Vsig even if the signal Vsig includes a relatively large offset voltage.

Thus, during initial startup, the value of NDAC is more positive than the value of PDAC. As the first tracking circuit acquires the positive peak, and the second tracking circuit acquires the negative peak, the values of PDAC and NDAC will invariably cross each other, and at one instant in time, the output signal voltages PDAC, NDAC from the two DACs 264a, 264b will be equal. The threshold voltages THRESHP, THRESHN will be equal to each other and to the output signal voltages PDAC, NDAC.

Under these conditions, the output signal $V_{out}$ would normally switch. The forcing circuit 270, however, forces and maintains the output signal $V_{out}$ at a predetermined voltage level until the value of PDAC becomes greater than the value of NDAC by a predetermined voltage level. The forcing circuit 270 may be provided, for example, from a switch circuit which couples the output signal path on which $V_{out}$ appears to a predetermined voltage. Alternatively, forcing circuit 270 may be provided from one or more combinatorial logic circuits. Alternatively, still, forcing circuit 270 may be provided from a combination of digital and analog switch and combinatorial logic circuits.

Regardless of the particular devices included in forcing circuit 270, circuit 270 prevents the output signal voltage $V_{out}$ from improperly switching due to the value of PDAC being reset to a value which is lower than the value of NDAC. The forcing circuit 270 also prevents switching of the output signal voltage until the value of PDAC exceeds the value of NDAC by a predetermined voltage to thus minimize the chance of the output signal voltage switching due to noise, internal hysteresis of comparators and tolerances of circuits included in the proximity detector 250.

If AGC were not employed in the proximity detector 250, the above condition would happen only once, at initial startup. If AGC is employed in the proximity detector and the AGC function is activated, the peak to peak value of the signal changes almost instantaneously due to the change in gain. When this happens, the DACs 264a, 264b will no longer be holding the correct value of the peaks, and the signal could decrease because of AGC to the point where it will no longer cross the thresholds of the peak-to-peak percentage threshold detector. Thus the circuit will simply stop switching.

Even if such an event does not occur, because the threshold voltages THRESHP, THRESHN are generated from PDAC and NDAC, which no longer represent the actual positive and negative peaks of the magnetic signal, the timing accuracy will suffer since the threshold voltage levels THRESHP, THRESHN will no longer be in the correct location relative to the actual peak to peak electrical signal.

To overcome these problems, each time AGC is engaged, a signal AGC_RESET is generated and provided to count circuits 262a, 262b which resets the two DACs 264a, 264b such that the values of PDAC and NDAC are set to values close to respective ones of the negative and positive rail voltages as described above. In normal operation of proximity detector 250, PDAC tracks the value of the positive peak of the signal $V_{sig}$ and NDAC tracks the value of the negative peak of the signal $V_{sig}$. Thus, under normal operating conditions of proximity detector 250, the value of PDAC exceeds the value of NDAC.

By setting the PDAC and NDAC values to their reset values as described above, the value of PDAC becomes less than the value of NDAC. This change in the relative amplitude relationship of PDAC and NDAC would cause the output signal voltage $V_{out}$ to change state. Thus, when the DACs 264a, 264b are reset, the output signal voltage $V_{out}$ must be reinforced in its present binary state to thus prevent the switching of output signal voltage $V_{out}$ due to the values of PDAC and NDAC being reset.

After the PDAC, NDAC values are reset, the tracking circuits require the new positive and negative peaks, respectively, of the signal $V_{sig}$. While the tracking circuits are requiring the new peaks, the value of PDAC will become greater than the value of NDAC. Thus, the output signal voltage $V_{out}$ must continue to be reinforced until such time as the value of PDAC becomes greater than the value of NDAC so that the output signal voltage $V_{out}$ will not switch as the output signal amplitudes PDAC, NDAC of the DACs 264a, 264b cross each other while moving to their reset values, and while the tracking circuits require the peak values of the signal $V_{sig}$.

The reinforcement is accomplished by the forcing circuit 270 forcing the output signal voltage $V_{out}$ to a predetermined value until such time that a minimum predetermined voltage change is detected in the signal voltage $V_{sig}$. The minimum predetermined voltage may be provided, for example, as a voltage having an amplitude greater than a voltage related to an internal hysteresis voltage of the threshold comparators 268a, 268b. Once the value of PDAC is greater than the value of NDAC, in response to comparator 426 detecting a voltage change in the signal voltage $V_{sig}$ which is greater than a voltage corresponding to the minimum predetermined voltage, the forcing circuit 270 discontinues forcing the output voltage $V_{out}$ to a predetermined value and allows the output voltage $V_{out}$ to switch in accordance with signal voltages provided to the threshold detectors 268a, 268b.

Figure 34:
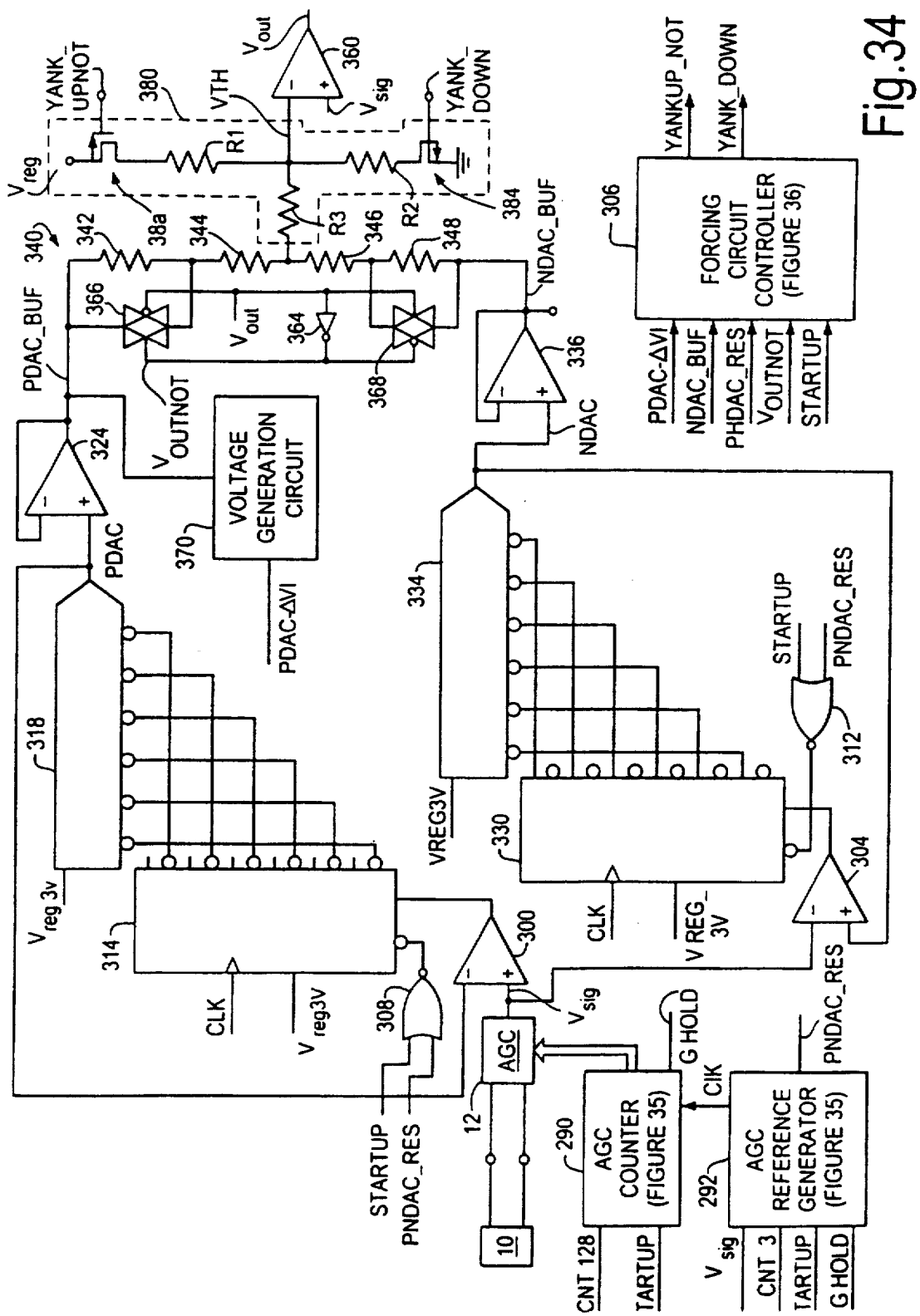
FIG. 34 is a schematic diagram of a proximity detector which includes a forcing circuit.

Referring now to FIG. 34, an alternate embodiment of a magnetic-article proximity detector is shown. The detector includes the Hal element 10 providing a Hal voltage to an optional automatic gain control circuit 12 which in turn provides an amplified Hall voltage, $V_{sig}$, as described above in conjunction with FIGS. 1, 13 and 22. The detector of FIG. 34 is operative to produce a binary square-wave output signal, $V_{out}$, at a first binary level when $V_{sig}$ rises to exceed a threshold voltage and another binary level when $V_{sig}$ falls below the threshold voltage. In the embodiment of FIG. 34, a single threshold voltage, VTH, is provided with hysteresis.

In the embodiment of FIG. 34, the threshold voltage is a percentage of the peak-to-peak voltage of $V_{sig}$ and is updated to remain the percentage, within a predetermined tolerance, of the $V_{sig}$ voltage. Accordingly, the detector can be descriptively referred to as peak-to-peak percentage threshold detector. In the embodiment of FIG. 34, the VTH threshold voltage is at a first level corresponding to a first percentage of $V_{sig}$ when $V_{sig}$ exceeds the threshold voltage and is at a second level corresponding to a second percentage of $V_{sig}$ when $V_{sig}$ is less than the threshold voltage (i.e., the threshold voltage VTH is provided with hysteresis).

It will be appreciated by those of ordinary skill in the art, and is within the scope of this invention, that the detectors described herein may be implemented in the form of, or to include, mid-signal detectors in which the threshold voltage is a fixed percentage of the $V_{sig}$ voltage or peak-referenced (i.e., slope-activated detectors). As one example, the peak-to-peak percentage threshold detectors may include a peak-referenced detector such that the detector output signal $V_{out}$ becomes one binary level when $V_{sig}$ rises to exceed a held negative peak excursion by a predetermined amount and another binary level when $V_{sig}$ falls to below a held positive peak excursion by a predetermined amount.

The $V_{sig}$ voltage is applied to the negative input of a first comparator 300 and to the positive input of a second comparator 304. The output signals of comparators 300 and 304 are coupled to respective ones of HOLD inputs of counters 314, 330. The output of counters 314, 330 are held constant (i.e., the counter is disabled) when the HOLD input signal is at a first logic level and is released (i.e., the counter is enabled) when the HOLD input signal is at the second logic level. In the illustrative embodiment, the counters 314, 330 are six bit counters which are enabled when the HOLD input is low.

A reference voltage VREG3V is applied to an UPDN input of counters 314, 330 and thus in this particular example counters 314, 330 count only in one direction, e.g. in the up direction. Those of ordinary skill in the art will appreciate of course that a control signal could be provided to the UPDN input of counters 314, 330 in order to control the count direction. Counters 314, 330 are each clocked by a system clock signal, CLK.

A pair of NOR gates 308, 312 each receive a signal STARTUP on a first input thereof and a signal PNDAC_RES on a second input thereof. The signal PNDAC_RES is provided by an AGC reference generator 292 described below in conjunction with FIG. 35. The outputs of NOR gates 308, 312 are coupled to respective ones of RESET ports of counters 314, 330. The output of counters 314, 330 are set to a first predetermined value when the RESET input signal is at a first logic level. Specifically, upon initial startup the signal STARTUP has high logic level thus causing NOR gates 308, 312 to produce a logic low output thereby causing counters 314, 330 to provide a first predetermined output value. Similarly, when AGC is engaged, the signal PNDAC_RES has high logic level thus causing NOR gates 308, 312 to produce a logic low output again causing counters 314, 330 to provide a first predetermined output value.

The outputs of the counter 314 are coupled to inputs of a Positive Digital-to-Analog Converter (PDAC) 318. The output of the PDAC 318 provides a voltage, PDAC, which is used to generate the detector threshold voltage, VTH, as will be described. In operation, the PDAC voltage varies in accordance with certain variations in the positive peak values of the $V_{sig}$ voltage. The resolution of the PDAC 318 is selected to ensure that changes in the VTH threshold voltage caused by changes in the PDAC voltage are substantially imperceptible. In the illustrative embodiment, the resolution of the PDAC 318 is 50 mV. The PDAC voltage is coupled to a buffer 324 and is fed back to the positive input of comparator 300, as shown.

The comparator 300, NOR gate 308, counter 314, PDAC 318 and buffer 324 comprise a "positive portion" of the detector circuitry. A "negative portion" of the detector is provided from comparator 304, NOR gate 312, counter 330, NDAC 334 and buffer 336. Specifically, the output of comparator 304 is coupled to the HOLD input of counter 330. The counter 330 is further responsive to the clock signal CIX and a reset signal provided from NOR gate 312.

The outputs of counter 330 are coupled to inputs of a Negative Digital-to-Analog Converter (NDAC) 334 which produces an NDAC voltage used, along with the PDAC voltage, to generate the VTH threshold voltage. The NDAC voltage varies in accordance with certain variations in the negative peak values of the $V_{sig}$ voltage. Like the PDAC 318, the resolution of the NDAC 334 is selected to ensure that changes in the VTH threshold voltage caused by changes in the NDAC voltage are substantially imperceptible. In the illustrative embodiment, the resolution of the NDAC 334 is 50 mV. The NDAC voltage is coupled to a buffer 336 and is further fed back to the negative input of comparator 304, as shown. Since the positive and negative portions of the detector circuitry provide signals PDAC, NDAC which track the positive and negative excursions of the signal voltage $V_{sig}$, these circuit portions may also be referred to as first and second tracking circuits respectively.

The buffered PDAC and NDAC voltages PDAC_BUF, NDAC_BUF are coupled to a resistor divider 340 comprising series resistors 342, 344, 346 and 348 in order to generate the VTH threshold voltage which is coupled to the negative input of threshold comparator 360 through resistor R3 for comparison to the $V_{sig}$ voltage. Comparator 360 provides at an output thereof the detector output signal, $V_{out}$, which is at a first binary, or logic level when the $V_{sig}$ voltage exceeds the VTH threshold voltage and is at a second binary level when the $V_{sig}$ voltage is less than the VTH threshold voltage.

The output of buffer 324 is also coupled to an input of a voltage generation circuit 370 which receives the buffered PDAC voltage PDAC_BUF and generates a signal voltage PDAC-$\Delta$V1, which is a predetermined voltage less than the PDAC_BUF voltage. Signal voltage PDAC-$\Delta$V1 is coupled to an input of a forcing circuit controller 306, the operation of which will be described in detail further below.

The VTH threshold voltage is set at a percentage of the peak-to-peak $V_{sig}$ voltage and is adaptive in the sense that it is updated in accordance with certain variations in the $V_{sig}$ voltage so as to remain the percentage, within a predetermined tolerance, of the peak-to-peak $V_{sig}$ voltage. As will become apparent, this arrangement is achieved by using the PDAC and NDAC voltages to generate the VTH threshold voltage and varying the PDAC and NDAC voltages in accordance with certain variations in the positive and negative peak values of $V_{sig}$, respectively.

The VTH threshold voltage is provided with hysteresis in the sense that VTH is at a first level corresponding to a first percentage of the peak-to-peak $V_{sig}$ voltage when $V_{sig}$ exceeds the VTH threshold voltage and is at a second level corresponding to a second percentage of the peak-to-peak $V_{sig}$ voltage when $V_{sig}$ is less than the VTH threshold voltage. That is, once the $V_{sig}$ voltage falls below the first level of the VTH threshold voltage, the VTH threshold voltage is increased so that the $V_{sig}$ voltage has to exceed a second, higher level of the VTH threshold voltage before the $V_{out}$ signal transitions. In the illustrative embodiment, the first and second percentages are fixed percentages of the peak-to-peak $V_{sig}$ voltage, but providing the percentages as variable percentages of the peak-to-peak $V_{sig}$ voltage is within the scope of the invention.

More particularly, a pair of switches 366, 368 is provided for selectively "shorting" respective resistors 342, 348. To this end, switches 366 and 368 are coupled in parallel with resistors 342 and 348 of resistor divider 340, respectively. The $V_{out}$ signal from comparator 360 is inverted by an inverter 364 to provide a signal $V_{outnot}$ which is applied to a control input of switches 366 and 368, as shown. A second control input of switches 366 and 368 is responsive to the $V_{out}$ signal.

A forcing circuit 380 has a first input coupled to a node of resistor divider 340 through resistor R3 as shown and a first output coupled to a negative input of comparator 360.

Forcing circuit 380 includes a first transistor switch 382 having a first terminal coupled to a reference voltage $V_{reg}$, a second terminal coupled through a resistor R1 to the negative input of comparator 360 as shown. A third or control terminal of transistor 382 received a control signal YANK_UPNOT from forcing circuit controller 306.

Forcing circuit 380 also includes a second transistor 384 having a first terminal ; coupled to a first reference voltage, here corresponding to ground, a second terminal coupled through a resistor R2 to the negative input of comparator 360 as shown and a third or control terminal coupled to a control signal YANK_DOWN from forcing circuit controller 306. In this particular embodiment, transistors 382, 384 are each provided as field effect transistors (FETs). In particular, transistor 382 is provided as a p-type metal oxide semiconductor field effect transistor (MOSFET) while transistor 384 is provided as an N-type MOSFET.

Forcing circuit controller 306 provides control signals YANK_UPNOT, YANK_DOWN having predetermined voltage levels in response to input signals PDAC-ΔV1, NDAC_BUF, PNDAC_RES, $V_{outnot}$ and STARTUP fed thereto. When control signals YANK_UPNOT, YANK_DOWN are provided having respective ones of low and high logic levels, transistors 382, 384 are biased in their conduction states and conversely when signals YANK_UPNOT, YANK_DOWN are provided having respective ones of high and low logic levels, transistors 382, 384 are biased in their nonconduction states.

In operation, with forcing circuit 380 disabled (i.e. transistors 382, 384 each biased into their non-conduction states) resistor divider circuit 340 provides a threshold voltage VTH which is coupled through resistor R3 to the negative input terminal of comparator 360 for comparison to the $V_{sig}$ voltage. In a preferred embodiment, resistor R3 is selected having a resistance value which is relatively high compared with the resistance value at the node of resistor divider circuit 340 to which resistor R3 is connected. Thus, there is relatively little voltage drop across R3. The output of comparator 360 provides the detector output signal, $V_{out}$, which is at a first binary, or logic level when the $V_{sig}$ voltage exceeds the threshold voltage VTH and is at a second binary level when the $V_{sig}$ voltage is less than the threshold voltage VTH.

When forcing circuit 380 is enabled, however, one of transistors 382, 384 is biased into its respective conduction state thereby pulling or forcing the signal voltage on the negative input of comparator 360 to one of two predetermined values. This, in turn, forces the output signal $V_{out}$ to a predetermined one of its binary states. Thus with the forcing circuit 380 enabled, the output signal $V_{out}$ is forced to and maintained at a predetermined value for as long as the forcing circuit 380 remains enabled.

As discussed above in conjunction with FIG. 33, operation of the proximity detector in peak-to-peak percentage threshold mode during initial proximity detector startup and during AGC operation requires the forcing circuit to be enabled in response to two conditions. Namely, the forcing circuit 380 is enabled during an initial startup interval and in response to every engagement of AGC. By forcing the signal $V_{out}$ to particular values in these two instances, the output signal voltage $V_{out}$ is forced to its correct binary state.

It should be noted that for operation at initial startup, circuit 380 need only include a single transistor since it is only necessary to force the signal voltage $V_{out}$ into either a high state or a low state. The two transistors of switch circuit 380, however, are required to support operation in AGC mode since in an AGC mode it may sometimes be necessary to force signal voltage $V_{out}$ high while other times it may be necessary to force signal voltage $V_{out}$ low.

It should also be noted that although forcing circuit 380 is here shown to include a pair of transistors, it should be appreciated that the function provided by forcing circuit 380 may be provided from a number of different circuits. For example, a current source may be used to turn the comparator 360 on and off. Alternately still, a combinatorial logic circuit may be coupled to the comparator output port to thus force the output voltage $V_{out}$ to a predetermined voltage level. Alternatively still, circuit 380 may include a mux or an operational amplifier rather than transistor switches to force the signal voltage $V_{out}$ into a predetermined state.

Figure 35:
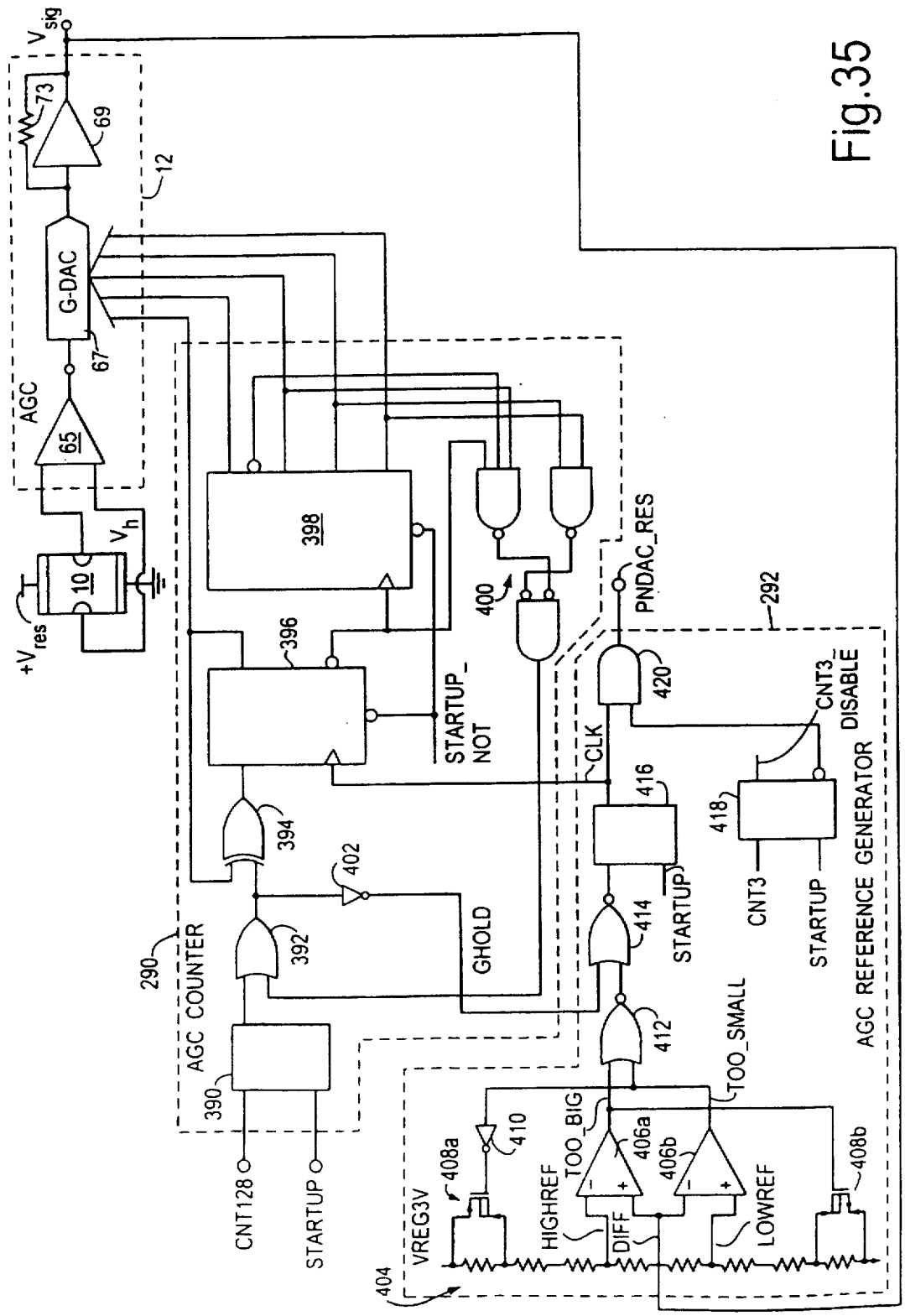
FIG. 35 is schematic diagram showing an AGC portion of a proximity detector.

Referring now to FIG. 35, the Hall element 10 has an output connected to the input of a Hall voltage amplifier 12 which includes a fixed-gain amplifier stage 65 a programmable-gain amplifier composed of a digital-to-analog converter G-DAC 67, an operational amplifier 69 and a resistor 73 coupled as shown. The operation of Hall voltage amplifier 12 is similar to that described above in conjunction with FIG. 1.

An AGC reference generator 292 is coupled to AGC counter 290 which in turn is coupled to voltage amplifier 12. AGC reference generator 292 provides a clock signal to AGC counter 290. AGC counter 290 provides a signal to G-DAC 67 to adjust the gain of amplifier 12 such that the signal $V_{sig}$ has a substantially constant peak-to-peak value regardless of the air gap to which the Hall element 10 is subject.

At initial startup, signal STARTUP is fed to a reset input of an RS latch 390 and a signal STARTUP_NOT is fed to reset inputs of a D flip-flop 396 and a counter 398 which are asserted low, thus, in response to signals STARTUP and STARTUP_NOT, latch 390, flip-flop 396 and counter 398 each provide predetermined output signals at output ports thereof. This results in amplifier 12 being set at a predetermined gain state.

Similarly, the startup signal STARTUP is fed to reset inputs of a one shot circuit 416 and an RS latch 418 in AGC reference generator 292. The outputs of one shot circuit 416 and RS latch 418 are coupled to the inputs of an AND logic gate 420 which provides the signal PNDAC_RES to an input of force controller circuit 306 (FIG. 34).

AGC reference generator 292 includes a pair of comparators 406a, 406b which receive the output signal $V_{sig}$ at respective ones of positive and negative ports as shown. The second input ports of comparators 406a, 406b are coupled to a resistor divider which generates signals HIGHREF and LOWREF at the second input ports of comparators 406a, 406b.

During AGC mode, comparator circuits 406a, 406b in AGC reference generator 292 provide signals TOO_BIG and TOO_SMALL in response to the signal voltage $V_{sig}$ being either greater than a reference voltage HIGHREF or lower than reference voltage LOWREF respectively. In response to the signal voltage $V_{sig}$ having a value such that AGC is activated, the signals TOO_BIG, TOO_SMALL are coupled through NOR gates 412, 414 to one shot 416.

In response to the signal $V_{sig}$ having a voltage level which is greater than the voltage level of HIGH REF, comparator 406a provides a logic high signal to an input of NOR gate 412. NOR gate 412 thus provides a logic low input to NOR gate 414 and if the count 128 signal has not yet been reached then the AGC is enabled. A one shot circuit 416 controls the duration of the forcing circuit control signal pulse (i.e. the yank pulse) in AGC mode by providing an appropriate signal to the input of AND gate 420.

Figure 36:
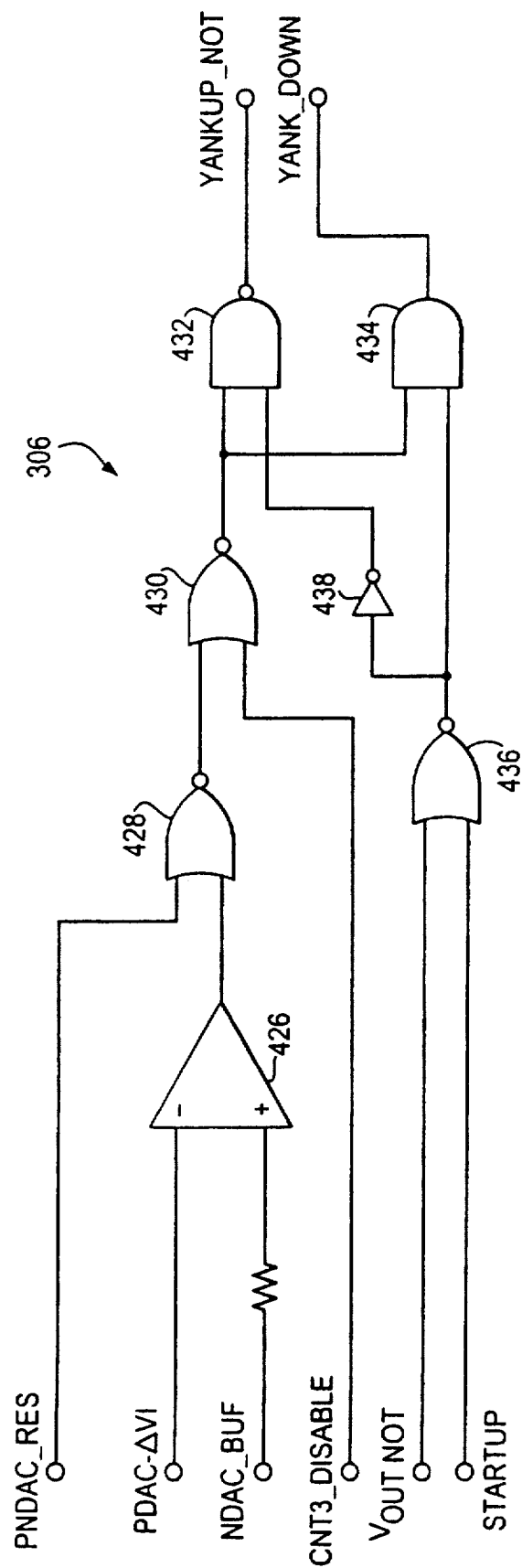
FIG. 36 is a schematic diagram of a forcing circuit controller circuit.

Referring now to FIG. 36, a forcing control circuit 306 which implements logic to appropriately enable and disable the forcing circuit 380 to carry out the operations described above in conjunction with FIGS. 33 and 34 is shown. It should be noted that although a particular set of logic gates is here shown, those of ordinary skill in the art will appreciate that other logic gates or circuits may be used to implement the same or similar logic functions suitable for the intended purpose of determining whether and when the comparator output voltage $V_{out}$ is forced high or low.

Forcing circuit controller 306 receives input signals and in response thereto determines when and in what direction to bias the negative input of comparator 360. Determining whether the comparator input is forced high or low also determines the signal level of output signal $V_{out}$. In this particular embodiment, forcing circuit controller 306 provides control signals YANK_UPNOT, YANK_DOWN to gate terminals of switches 382, 384, to thus bias the switches into conduction or non-conduction states and thereby coupling the negative input of comparator 360 (FIG. 34) to a reference voltage close to one of the rail voltages thereby determining the signal level of output signal $V_{out}$.

At startup, the signal CNT3_DISABLE has a logic low signal level and the signal STARTUP is provided having a logic high signal level. Thus the output of NOR gate 436 is a logic zero and the input to NAND gate 432 is also a logic one.

The value PDAC-ΔV1 is initially set to a low value and the value NDAC_BUF is set to a value close to the positive rail voltage and thus comparator 426 provides a logic one at the output thereof. This results in NOR gate 428 providing a logic zero at an output thereof. The signal CNT3_DISABLE is also a logic zero and thus NOR gate 430 provides a logic one to an input of NAND gate 432. Thus NAND gate 432 provides a signal YANK_UPNOT having a value of logic zero which biases transistor 382 into its conduction state thereby forcing the output signal $V_{out}$ to a predetermined value which in this case is a logic low value. It should be appreciated that output signal $V_{out}$ could alternatively have been forced to a high logic value. The particular value to which $V_{out}$ is forced may be selected to satisfy the requirements of a particular application.

In AGC operation, comparator 426 receives the signal PDAC-ΔV1 on a negative input port thereof and signal NDAC_BUF on a positive input port thereof. The output of comparator 426 switches when the value of PDAC-ΔV1 exceeds the value of NDAC_BUF. Thus, comparator 426 does not allow the forcing circuit to release the output signal voltage $V_{out}$ until the signals PDAC_BUF and NDAC_BUF are separated by a predetermined voltage level. The predetermined voltage level ΔV1 is select to assure that false switching will not occur. In this particular application, the predetermined voltage is selected to be 150 millivolts (mv).

Figure 37:
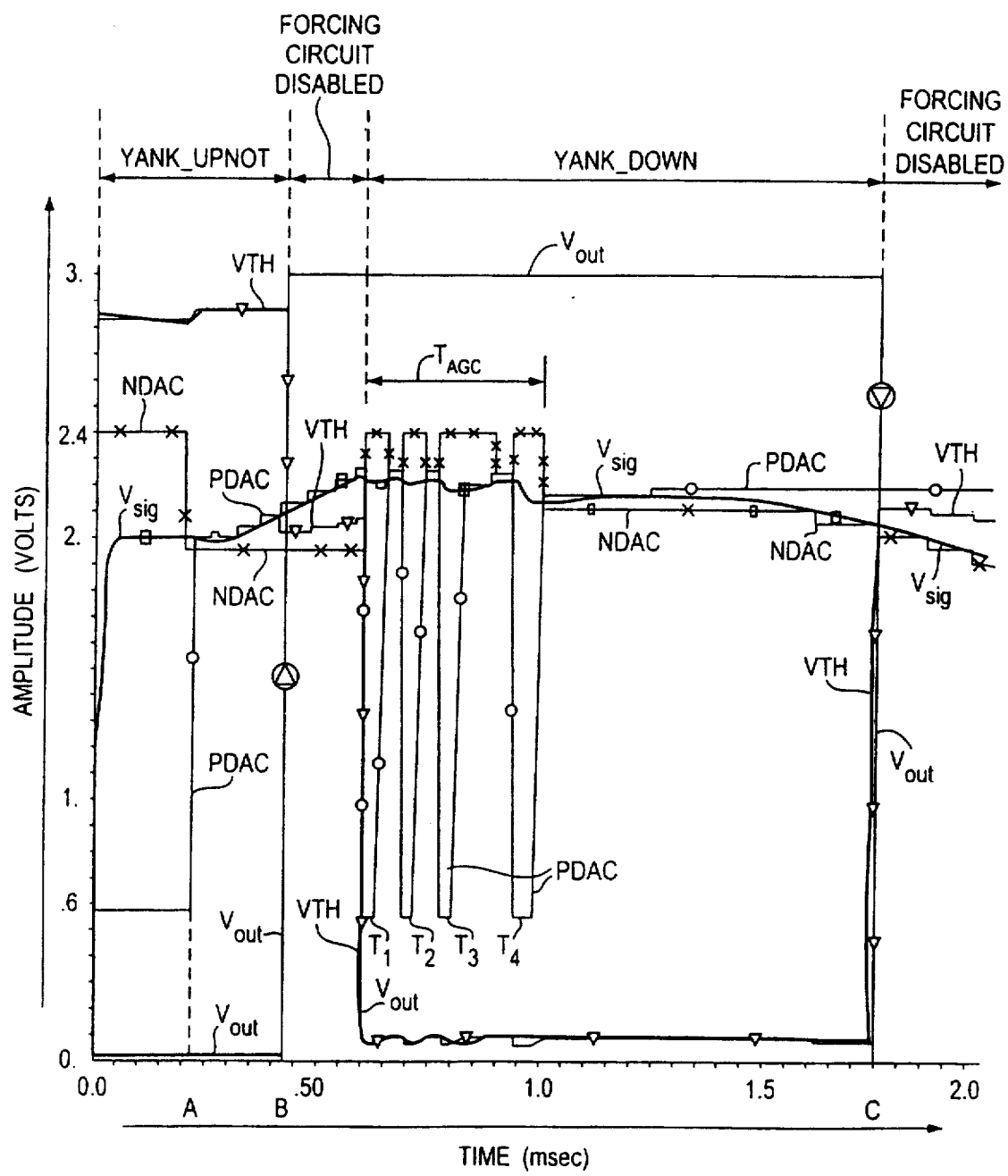
FIG. 37 is a plot of amplitude versus time showing a comparator output signal, tracking signals PDAC and NDAC and a forcing circuit control signal.

Referring now to FIG. 37, a plot of signal amplitude versus time is shown. In the plot, it can be seen that at time zero, initial power occurs and the value of PDAC is set to a value which is lower than the least positive expected value of the signal voltage $V_{sig}$ and the value of NDAC is set to a value which is greater than the least negative expected value of signal voltage $V_{sig}$. In this particular embodiment, the supply voltage is three volts and the reset value for the signal PDAC is about 0.57 volt while the reset value for the signal NDAC is about 2.43 volts. Since the value of PDAC is less than the value of NDAC, the forcing or yank function is enabled.

After a brief reset period, the value of PDAC increases until reaching the value of $V_{sig}$ and the value of NDAC decreases until reaching the value of $V_{sig}$. At time A, the value of PDAC is slightly greater than the value of NDAC. At time A, however, the value of PDAC is not greater than the value of NDAC by an amount ΔV1 required to allow the forcing circuit to be disabled. In this particular embodiment, the value of PDAC must be greater than the value of NDAC by three bits which equals a voltage of 150 millivolts. Thus, at time A the forcing circuit is still enabled.

It is necessary to force the comparator input to a predetermined level to keep the comparator from oscillating in this circuit implementation, as well as to maintain the comparator's previous state. When PDAC is less than NDAC, switches 366 and 368 cause positive hysteresis with the threshold comparator 360 (FIG. 34). The forcing circuit breaks the positive feedback loop by biasing the comparator's input to hold the comparator in its present state.

The signal voltage VTH is coupled to the negative input of threshold comparator 360 (FIG. 34). The negative input of comparator 360 is also the input which is forced to one of high and low reference voltages as shown in FIG. 37. Until the value of PDAC exceeds the value of NDAC by a voltage level not less than the predetermined voltage level, the switch 382 is biased into its conduction state thus forcing the signal voltage VTH toward a voltage close to the positive rail voltage. This has the effect of keeping the output signal voltage $V_{out}$ low. Although in this particular example the output signal voltage $V_{out}$ is selected to be in a low state at initial startup, in some applications it may be desirable to force the output signal voltage $V_{out}$ into a high state at initial startup.

Once the peak-to-peak signal is greater than the predetermined voltage ΔV1, the forcing circuit is disabled and the signal voltage VTH is 35% of the difference between the signals PDAC_BUF and NDAC_BUF. The threshold comparator 360 switches at time B since the signal voltage $V_{sig}$ is greater than the threshold voltage VTH by more than the predetermined threshold voltage.

The amplitude of signal voltage $V_{sig}$ continues to increase until it reaches the HIGHREF threshold and thus triggering the first AGC cycle during time period $T_{AGC}$. Since the comparator output is high when AGC is engaged, transistor 382 is biased into its non-conduction state and transistor 384 is biased into its conduction state to hold the comparator in its present state. In FIG. 37 the signal voltage VTH is forced to a voltage close to the negative rail voltage and held until the value of PDAC (or PDAC_BUF) is greater than the value of NDAC (or NDAC_BUF) by the predetermined voltage level which in this particular example is equal to 150 mV.

Yank down remains enabled until time C because the difference between PDAC and NDAC is less than the predetermined voltage of 150 mV. PDAC is reset to its minimum reset value and NDAC to its maximum reset value, and then PDAC and NDAC are again allowed to track the signal $V_{sig}$. Four cycles of AGC occur, as can be clearly seen in FIG. 37 by PDAC resetting down at times $T_1$, $T_2$, $T_3$, $T_4$. After time $T_4$, the signal $V_{sig}$ reaches the positive peak and PDAC, NDAC again start to track the signal $V_{sig}$. Once NDAC reaches a value such that the value of NDAC is less than the value of PDAC by a predetermined voltage, the forcing circuit is disabled as shown at time C. This allows the comparator to switch normally, and since the signal voltage VTH is now greater than the signal $V_{sig}$, the comparator output switches low (time C).

Having described the preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims. All publications and references cited herein are expressly incorporated herein by reference in their entirety.

What is claimed is:

1. A proximity detector for sensing magnetic articles comprising:

a) a magnetic-field-to-voltage transducer for generating at an output port thereof a signal voltage, $V_{sig}$, that is proportional to a magnetic field;

b) a peak-to-peak percentage threshold detector having an input port coupled to the output port of said magnetic-field-to-voltage transducer to receive the signal voltage $V_{sig}$ and for providing an output signal voltage $V_{out}$; and c) a forcing circuit coupled to said peak-to-peak percentage threshold detector for maintaining the value of the output signal voltage $V_{out}$ at a first predetermined value during an initial startup interval of the proximity detector.

2. The proximity detector of claim 1 wherein:

said peak-to-peak percentage threshold detector further comprises a threshold comparator having a first input terminal coupled to the output port of said magnetic-field-to-voltage transducer to receive the signal voltage, $V_{sig}$, and having a second input terminal coupled to receive a threshold signal voltage VTH and the initial startup interval lasts at least until a voltage change in the signal voltage $V_{sig}$ which is greater than a predetermined voltage is detected.

3. The proximity detector of claim 2 wherein the predetermined voltage is not less than an internal hysteresis voltage of said threshold comparator.

4. The proximity detector of claim 1 wherein said peak-to-peak percentage threshold detector further comprises:

a first tracking circuit having input coupled to the output of said magnetic-field-to-voltage transducer to receive the signal voltage, $Vd_{sig}$, and to generate at an output thereof a signal voltage PDAC that tracks the highest peak of the signal voltage $V_{sig}$;

a second tracking circuit having input coupled to the output of said magnetic-field-to-voltage transducer to receive the signal voltage, $V_{sig}$, and to generate at an output thereof a voltage NDAC that tracks the lowest peak of the signal voltage $V_{sig}$; and a circuit for setting an initial starting voltage of the signal voltage PDAC to a value which is less than an initial starting voltage of the signal voltage NDAC and wherein the initial startup interval lasts at least until the value of PDAC is greater than the value of NDAC.

5. The proximity detector of claim 2 wherein:

(a) said peak-to-peak percentage threshold detector further comprises:

a first tracking circuit having an input coupled to the output of said magnetic-field-to-voltage transducer to receive the signal voltage, $V_{sig}$, and to generate at an output thereof a signal voltage PDAC that tracks the highest peak of the signal voltage $V_{sig}$;

a second tracking circuit having an input coupled to the output of said magnetic-field-to-voltage transducer to receive the signal voltage, $V_{sig}$, and to generate at an output thereof a voltage NDAC, that tracks the lowest peak of the signal voltage $V_{sig}$; and a resistor divider having a fist terminal coupled to the output port of said first tracking circuit, having a second terminal coupled to the output port of said second tracking circuit and having a third terminal coupled to the second input terminal of said threshold detector, said resistor divider for providing the threshold signal voltage VTH at the third terminal thereof; and (b) said circuit is coupled to the second input terminal of said threshold comparator.

6. The proximity detector of claim 5 wherein said forcing circuit comprises a switch circuit having a first terminal coupled to the second input terminal of said threshold comparator, a second terminal coupled to a first reference voltage and a control terminal coupled to receive a control signal and in response to the control signal having a first value said switch circuit provides a first voltage level to the second input terminal of said threshold comparator and in response to the control signal having a second value said switch circuit provides a second different voltage level to the second input terminal of said threshold comparator.

7. The proximity detector of claim 6 wherein said switch circuit further comprises:

a first transistor having a first terminal coupled to the second input terminal of said threshold comparator, a second terminal coupled to a first reference voltage and a control terminal;

a second transistor having a first terminal coupled to the second input terminal of said threshold comparator, a second terminal coupled to a second reference voltage and a control terminal; and a logic circuit for receiving a startup signal and for providing predetermined control signals to the control terminals of said first and second transistors in response to the startup signal having a predetermined value.

8. The proximity detector of claim 7 wherein:

said first transistor is a field effect transistor having source, drain and gate electrodes and wherein the first terminal corresponds to the drain electrode, the second terminal corresponds to the source electrode and the control terminal corresponds to the gate electrode;

said second transistor is a field effect transistor having source, drain and gate electrodes wherein the first terminal corresponds to the drain electrode, the second terminal corresponds to the source electrode and the control terminal corresponds to the gate electrode;

said first reference voltage corresponds to a positive reference voltage; and said second reference voltage corresponds to ground.

9. The proximity detector of claim 8 wherein:

(a) said first tracking circuit comprises:

(1) a first comparator having a first input port coupled to the output port of said magnetic-field-to-voltage transducer, having a second input port and having an output port;

(2) a second counter having a first input port coupled to the output port of said first comparator, a clock port for receiving a clock signal, a startup port for receiving a startup signal and an output port; and (3) a first digital-to-analog converter having an input port coupled to the output port of said second counter and having an output port coupled to the second input port of said first comparator and corresponding to the output port of said first tracking circuit; and (b) said second tracking circuit comprises:

(1) a second comparator having a first input port coupled to the output port of said magnetic-field-tovoltage transducer, having a second input port and having an output port;

(2) a first counter having a first input port coupled to the output port of said second comparator, a clock port for receiving a clock signal, a startup port for receiving a startup signal and an output port; and (3) a second digital-to-analog converter having an input port coupled to the output port of said first counter and having an output port coupled to the second input port of said second comparator and corresponding to the output port of said second tracking circuit.

10. A method for starting a proximity detector including a magnetic-field-to-voltage transducer which provides a signal voltage, $V_{sig}$ to a peak-to-peak percentage threshold detector which includes first and second tracking circuits and a threshold comparator and which generates an output signal voltage $V_{out}$, the method comprising the steps of:

(a) setting an output value of the first tracking circuit to a value which is lower than the least positive expected value of the signal voltage $V_{sig}$ wherein the first tracking circuit receives the signal voltage $V_{sig}$, and generates at an output port thereof a voltage PDAC, that tracks the highest peak of the signal voltage $V_{sig}$;

(b) setting an output value of the second tracking circuit to a value which is greater than the least negative expected value of the signal voltage $V_{sig}$ wherein the second tracking circuit receives the signal voltage $V_{sig}$, and generates at an output port thereof a signal voltage NDAC, that tracks the lowest peak of the signal voltage $V_{sig}$; and (c) maintaining the output signal voltage $V_{out}$ at a first predetermined value by applying a reference voltage to an input terminal of the threshold comparator, wherein the value of the output signal voltage $V_{out}$ is maintained at least until the peak-to-peak percentage threshold detector detects a change in the signal voltage $V_{sig}$ which is greater than a predetermined voltage.

11. The method of claim 10 further comprising the steps of:

(d) sensing an ambient magnetic field and generating the voltage, $V_{sig}$, that is proportional to the magnetic field; and (e) in response to detection of a voltage change in the signal voltage $V_{sig}$ which is greater than the predetermined voltage, removing the reference voltage from the input terminal of the threshold comparator.

12. The method of claim 11 wherein the step of maintaining the output signal voltage $V_{out}$ at a first predetermined value by applying a reference voltage to an input terminal of the threshold comparator comprises the steps of:

biasing a first transistor coupled between a reference voltage and the input terminal of the threshold comparator into a first one of a conduction state and a non-conduction state.

13. The method of claim 12 wherein the step of removing the reference voltage from the input terminal of the threshold comparator includes the step of:

biasing the first transistor into a second one of the conduction and non-conduction states.

14. A proximity detector for sensing magnetic articles comprising:

(a) a magnetic-field-to-voltage transducer for generating at an output port thereof a signal;

(b) an automatic gain control circuit having an input port coupled to the output port of said magnetic-field-to-voltage transducer and having an output port, said automatic gain control circuit for controlling the amplitude of a signal voltage $V_{sig}$, that is proportional to a magnetic field;

(c) a peak-to-peak percentage threshold detector having an input port coupled to the output port of said automatic gain control circuit to receive the signal voltage $V_{sig}$ and for providing an output signal voltage $V_{out}$; and (d) a circuit coupled to said automatic gain control circuit and said peak-to-peak percentage threshold detector for maintaining the value of the output signal voltage $V_{out}$ at a first predetermined value to prevent said peak-to-peak percentage threshold detector from switching prior to one of a positive or negative excursion of the signal voltage $V_{sig}$ reaching a predetermined threshold voltage when said automatic gain control circuit controls the amplitude of the signal voltage $V_{sig}$.

15. The proximity detector of claim 14 wherein:

said peak-to-peak percentage threshold detector further comprises:

a first tracking circuit having an input port coupled to the output port of said magnetic-field-to-voltage transducer to receive the signal voltage, $V_{sig}$, and to generate at an output port thereof a signal voltage PDAC, that tracks the highest peak of the signal voltage $V_{sig}$;

a second tracking circuit having an input port coupled to the output port of said magnetic-field-to-voltage transducer to receive the signal voltage, $V_{sig}$, and to generate at an output port thereof a voltage NDAC, that tracks the lowest peak of the signal voltage $V_{sig}$; and a threshold comparator having a first input terminal coupled to the output port of said automatic gain control circuit to receive the signal voltage, $V_{sig}$, and having a second input terminal coupled to the receive a threshold voltage VTH;

said automatic gain control circuit comprises:

a logic circuit coupled to said first and second tracking circuits, said logic circuit to generate a reset signal to reset the voltage PDAC of said first tracking circuit to a value which is lower than the least positive expected value of the signal voltage $V_{sig}$ and to reset the voltage NDAC of said second tracking circuit to a value which is greater than the least negative expected value of the signal voltage $V_{sig}$; and said circuit maintains the value of the output signal voltage $V_{out}$ at a first predetermined value at least until the percentage of peak-to-peak detector detects a voltage change in the signal voltage $V_{sig}$ which is greater than a predetermined voltage.

16. The proximity detector of claim 15 wherein:

said peak-to-peak percentage threshold detector further comprises:

a resistor divider having a first terminal coupled to the output port of said first tracking circuit, having a second terminal coupled to the output port of said second tracking circuit and having a third terminal coupled to the second input terminal of said threshold detector, said resistor divider for providing the threshold voltage VTH at the third terminal thereof; and said circuit is coupled to the second input terminal of said threshold comparator.

17. The proximity detector of claim 16 wherein said circuit comprises a switch circuit having a first terminal coupled to the second input terminal of said threshold comparator, a second terminal coupled to a first reference voltage and a control terminal coupled to receive a control signal wherein in response to the control signal having a first value said switch circuit provides a first voltage level to the second input terminal of said threshold comparator and in response to the control signal having a second value said switch circuit provides a second different voltage level to the second input terminal of said threshold comparator.

18. The proximity detector of claim 17 wherein said switch circuit fiber comprises:

a first transistor having a first terminal coupled to the second input terminal of said threshold comparator, a second terminal coupled to a first reference voltage and a control terminal;

a second transistor having a first terminal coupled to the second input terminal of said threshold comparator, a second terminal coupled to a second reference voltage and a control terminal; and a logic circuit for receiving one of a startup signal and a reset signal and for providing predetermined control signals to the control terminals of said first and second transistors in response to the one of the startup signal and reset signal.

19. The proximity detector of claim 18 wherein:

said first transistor is a field effect transistor having a source electrode corresponding to the first terminal, a drain electrode corresponding to the second terminal and a gate electrode corresponding to the third terminal;

said second transistor is a field effect transistor having a source electrode corresponding to the first terminal, a drain electrode corresponding to the second terminal and a gate electrode corresponding to the third terminal;

said first reference voltage corresponds to a positive reference voltage; and said second reference voltage corresponds to ground.

20. The proximity detector of claim 19 wherein:

(a) said first tracking circuit comprises:

(1) a first comparator having a first input port coupled to the output port of said magnetic-field-to-voltage transducer, having a second input port and having an output port;

(2) a first counter having a first input port coupled to the output port of said first comparator, a clock port for receiving a clock signal, a startup port for receiving a startup signal and an output port; and (3) a first digital-to-analog converter having an input port coupled to the output port of said first counter and having an output port coupled to the second input port of said first comparator and corresponding to the output port of said first tracking circuit; and (b) said second tracking circuit comprises:

(1) a second comparator having a first input port coupled to the output port of said magnetic-field-to-voltage transducer, having a second input port and having an output port;

(2) a second counter having a first input port coupled to the output port of said second comparator, a clock port for receiving a clock signal, a startup port for receiving a startup signal and an output port; and (3) a second digital-to-analog converter having an input port coupled to the output port of said second counter and having an output port coupled to the second input port of said second comparator and corresponding to the output port of said second tracking circuit.

21. A method for operating a proximity detector including a magnetic-field-to-voltage transducer coupled to an automatic gain control circuit which provides a signal voltage $V_{sig}$ to a peak-to-peak percentage threshold detector which includes first and second tracking circuits and a threshold comparator and which generates an output signal voltage $V_{out}$, the method comprising the steps of:

(a) setting an output value of the first tracking circuit to a value which is lower than the least positive expected value of the signal voltage $V_{sig}$ wherein the first tracking circuit receives the signal voltage $V_{sig}$, and generates at an output port thereof a voltage PDAC, that tracks the highest peak of the signal voltage $V_{sig}$;

(b) setting an output value of the second tracking circuit to a value which is greater than the least negative expected value of the signal voltage $V_{sig}$ wherein the second tracking circuit receives the signal voltage $V_{sig}$, and generates at an output port thereof a voltage NDAC, that tracks the lowest peak of the signal voltage $V_{sig}$;

(c) maintaining a value of the output signal voltage $V_{out}$ at a first predetermined value by applying a reference voltage to an input terminal of the threshold comparator, wherein the value is maintained at least until the peak-to-peak percentage threshold detector detects a change in the signal voltage $V_{sig}$ which is greater than a predetermined voltage.

22. The method of claim 21 further comprising the steps of:

(d) resetting the voltage PDAC of said first tracking circuit to a value which is lower than the least positive expected value of the signal voltage $V_{sig}$ in response to an automatic gain control enable pulse; and (e) resetting the voltage NDAC of said second tracking circuit to a value which is greater than the least negative expected value of the signal voltage $V_{sig}$ in response to the automatic gain control enable pulse.

23. The method of claim 22 further comprising the steps of:

sensing an ambient magnetic field that is influenced by the passing of magnetic articles and generating the voltage, Vsig, that is proportional to the magnetic field; and in response to the peak-to-peak percentage threshold detector detecting a voltage change in the signal voltage $V_{sig}$ which is greater than a voltage corresponding to an internal hysteresis voltage of the threshold comparator, removing the reference voltage from the input terminal of the threshold comparator.

24. The method of claim 23 wherein the step of maintaining the value of the output signal voltage $V_{out}$ at a first predetermined value by applying a reference voltage to an input terminal of the threshold comparator comprises the steps of:

biasing a first transistor into a first one of a conduction and non-conduction states.

25. The method of claim 24 wherein the step of removing the reference voltage from the input terminal of the threshold comparator includes the step of:

biasing the first transistor into a second one of a conduction and non-conduction states.

* * * * *